(12) United States Patent
Nayebi et al.

(10) Patent No.: US 11,240,089 B2
(45) Date of Patent: Feb. 1, 2022

(54) METHODS AND APPARATUS FOR TRANSMIT IQ MISMATCH CALIBRATION

(71) Applicant: Samsung Electronics Co., Ltd., Suwon-si (KR)

(72) Inventors: Elina Nayebi, San Diego, CA (US); Pranav Dayal, San Diego, TX (US); Kee-Bong Song, San Diego, TX (US)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 17/092,214

(22) Filed: Nov. 6, 2020

(65) Prior Publication Data

US 2021/0359896 A1 Nov. 18, 2021

Related U.S. Application Data

(60) Provisional application No. 63/025,980, filed on May 15, 2020.

(51) Int. Cl.
*H04L 27/36* (2006.01)
*H03F 1/32* (2006.01)
*H04B 1/04* (2006.01)
*H04L 27/38* (2006.01)

(52) U.S. Cl.
CPC ......... *H04L 27/364* (2013.01); *H03F 1/3247* (2013.01); *H04B 1/0475* (2013.01); *H04L 27/3863* (2013.01)

(58) Field of Classification Search
CPC ..... H04L 27/36; H04L 27/362; H04L 27/364; H04L 27/3863; H04B 1/04; H04B 1/0475; H04B 1/0483; H04B 1/10; H04B 2001/0491; H03F 1/3247
See application file for complete search history.

(56) References Cited

U.S. PATENT DOCUMENTS

| 8,184,739 | B2 | 5/2012 | Ohkawara et al. |
| 9,231,839 | B1 | 1/2016 | Chen et al. |
| 10,097,396 | B2* | 10/2018 | Sestok, IV ............ H04L 27/366 |
| 10,225,118 | B1* | 3/2019 | Hagiwara ........... H04L 27/0014 |

(Continued)

OTHER PUBLICATIONS

Cavers, James K., "New Methods for Adaptation of Quadrature Modulators and Demodulators in Amplifier Linearization Circuits", IEEE Transactions on Vehicular Technology, vol. 46, No. 3, Aug. 1997, pp. 707-716.

(Continued)

*Primary Examiner* — Siu M Lee
(74) *Attorney, Agent, or Firm* — Renaissance IP Law Group LLP

(57) ABSTRACT

A method of pre-compensating for transmitter in-phase (I) and quadrature (Q) mismatch (IQMM) may include sending a signal through an up-converter of a transmit path to provide an up-converted signal, determining the up-converted signal, determining one or more IQMM parameters for the transmit path based on the determined up-converted signal, and determining one or more pre-compensation parameters for the transmit path based on the one or more IQMM parameters for the transmit path. In some embodiments, the up-converted signal may be determined through a receive feedback path. In some embodiments, the up-converted signal may be determined through an envelope detector.

10 Claims, 13 Drawing Sheets

(56) References Cited

U.S. PATENT DOCUMENTS

| | | |
|---|---|---|
| 10,412,698 B2 | 9/2019 | Gou et al. |
| 2009/0310711 A1* | 12/2009 | Chiu .................... H04L 27/364 |
| | | 375/302 |
| 2010/0195706 A1* | 8/2010 | Yanagisawa .......... H04L 27/364 |
| | | 375/226 |
| 2016/0173317 A1* | 6/2016 | Bitton ................... H04L 27/364 |
| | | 455/114.2 |
| 2016/0294437 A1* | 10/2016 | Alavi ..................... H04B 1/123 |
| 2016/0359614 A1* | 12/2016 | Hao ........................ H04L 7/033 |
| 2019/0380101 A1 | 12/2019 | Gou et al. |
| 2020/0169342 A1* | 5/2020 | Venkatraman ....... H04B 17/364 |
| 2020/0169434 A1* | 5/2020 | Tangudu .............. H04B 1/0028 |

OTHER PUBLICATIONS

Cavers, James K., et al., "Adaptive Compensation for Imbalance and Offset Losses in Direct Conversion Transceivers", IEEE Transactions on Vehicular Technology, vol. 42, No. 4, Nov. 1993, pp. 581-588.

Faulkner, M. et al., "Automatic Adjustment of Quadrature Modulators", Electronics Letters, vol. 27, No. 3, Jan. 31, 1991, pp. 214-216.

* cited by examiner

| Transmitted Signal | Received Signal | Equations |
|---|---|---|
| | | $R_{1,k} = A_{TX} A_{RX} G_{1TX}(f_k)$ |
| | | $R_{2,k} = A_{TX}^* A_{RX} G_{2TX}(-f_k)$ |
| | | $R_{3,k} = A_{TX}^* A_{RX} G_{1TX}(-f_k)$ |
| | | $R_{4,k} = A_{TX} A_{RX} G_{2TX}(f_k)$ |

FIG. 5

METHODS AND APPARATUS FOR TRANSMIT IQ MISMATCH CALIBRATION

CROSS-REFERENCE TO RELATED APPLICATIONS

This application claims priority to, and the benefit of, U.S. Provisional Patent Application Ser. No. 63/025,980 titled "Transmitter Frequency-Dependent In-Phase and Quadrature Mismatch Calibration" filed May 15, 2020 which is incorporated by reference.

TECHNICAL FIELD

This disclosure relates generally to quadrature transmitters, and more specifically to transmit IQ mismatch calibration.

BACKGROUND

A quadrature transmitter may include an in-phase (I) path and a quadrature (Q) path. Imbalances between the I and Q paths, which may be referred to as IQ mismatch (IQMM), may degrade the performance of the transmitter.

The above information disclosed in this Background section is only for enhancement of understanding of the background of the invention and therefore it may contain information that does not constitute prior art.

SUMMARY

A method of pre-compensating for transmitter in-phase (I) and quadrature (Q) mismatch (IQMM) may include sending a signal through an up-converter of a transmit path to provide an up-converted signal, determining the up-converted signal through a down-converter of a receive feedback path, determining one or more IQMM parameters for the transmit path based on the determined up-converted signal, and determining one or more pre-compensation parameters for the transmit path based on the one or more IQMM parameters for the transmit path. Determining one or more IQMM parameters for the transmit path may include solving a system of equations, a first one of the equations may include a first component of the up-converted signal and a first parameter representing, at least in part, a desired frequency response of the transmit path, and a second one of the equations may include a second component of the up-converted signal and a second parameter representing, at least in part, a frequency response of the transmit path due to transmit IQMM. The first one of the equations may further include a third parameter representing, at least in part, a gain and delay for the transmit path. The method may further include determining an IQMM for the receive feedback path by using a first local oscillator for the transmit path and a second local oscillator for the receive path, and determining one or more IQMM parameters for the transmit path based on the determined up-converted signal may include processing the up-converted signal to compensate for the IQMM in the receive path. A local oscillator for the transmit path may have a frequency shift from a local oscillator for the receive feedback path. The signal may include a first signal at a first frequency, the up-converted signal may include a first up-converted signal, and the method may further include sending a second signal at a second frequency through the up-converter of the transmit path to provide a second up-converted signal, determining the second up-converted signal through the down-converter of the receive feedback path, and determining one or more IQMM parameters for the transmit path based on the determined second up-converted signal.

A method of pre-compensating for transmitter in-phase (I) and quadrature (Q) mismatch (IQMM) may include sending a signal through an up-converter of a transmit path to provide an up-converted signal, determining the up-converted signal through an envelope detector, determining one or more IQMM parameters for the transmit path based on the determined up-converted signal, and determining one or more pre-compensation parameters for the transmit path based on the one or more IQMM parameters for the transmit path. Determining one or more IQMM parameters for the transmit path may include applying a first pre-compensation parameter to the transmit path, determining a first power of a component of the up-converted signal caused by transmit IQMM through the envelope detector based on the first pre-compensation parameter, applying a second pre-compensation parameter to the transmit path, and determining a second power of a component of the up-converted signal caused by transmit IQMM through the envelope detector based on the second pre-compensation parameter. Determining one or more IQMM parameters for the transmit path may further include selecting one of the first pre-compensation parameter or the second pre-compensation parameter based on a lower of the first power and the second power. The method may further include applying one or more additional pre-compensation parameters to the transmit path, and determining one or more additional powers of one or more components of the up-converted signal caused by transmit IQMM through the envelope detector based on the one or more additional pre-compensation parameters, and determining one or more IQMM parameters for the transmit path may include selecting one of the first pre-compensation parameter, the second pre-compensation parameter or the one or more additional pre-compensation parameters based on a lower of the first power, the second power, or the one or more additional powers. The signal may include a first signal at a first frequency, the up-converted signal may include a first up-converted signal, and the method may further include sending a second signal at a second frequency through the up-converter of the transmit path to provide a second up-converted signal, determining the second up-converted signal through the envelope detector, and determining one or more IQMM parameters for the transmit path based on the determined second up-converted signal. The method may further include applying first and second pre-compensation parameters to the transmit path for each of the first and second signals, and the first and second up-converted signals may be determined separately based on the first and second pre-compensation parameters. Determining one or more IQMM parameters for the transmit path may include solving a system of equations based on the determined first and second up-converted signals. A first one of the system of equations may include a function, at least in part, of the first and second pre-compensation parameters. The second frequency may be a negative of the first frequency at baseband. The method may further include sweeping the first and second frequencies for each of the first and second pre-compensation parameters, determining additional first and second up-converted signals based on sweeping the first and second frequencies, and determining one or more IQMM parameters for the transmit path over frequency based on the determined additional up-converted signals. The signal may include a first two-tone signal, the up-converted signal may include a first up-converted two-tone signal, and the method may further include sending a second two-tone signal through the up-converter of the transmit path to provide a second up-converted two-tone signal, determining the second up-converted two-tone signal through the envelope detector, and determining one or more IQMM parameters for the transmit path based on the determined second up-converted two-tone signal. Determining one or more IQMM parameters for the transmit path may include solving a system of equations based on the determined first and second up-converted two-tone signals, and at least one of the equations may include a first parameter of a first frequency of the first two-tone signal and a second parameter of a second frequency of the first two-tone signal. The method may further include sweeping first and second frequencies of at least one of the two-tone signals, determining additional first and second up-converted two-tone signals based on sweeping the first and second frequencies, and determining one or more IQMM parameters for the transmit path over frequency based on the determined additional up-converted two-tone signals.

A system may include an IQ transmit path comprising an up-converter, an envelope detector arranged to provide an envelope of an up-converted signal from the IQ transmit path, a signal generator arranged to apply a pilot signal to the IQ transmit path, a signal observer arranged to capture the envelope of the up-converted signal based on the pilot signal, and a processor configured to: estimate one or more IQ mismatch (IQMM) parameters for the IQ transmit path based on the captured envelope of the up-converted signal, and estimate one or more compensation coefficients for the IQ transmit path based on the estimated IQMM parameters. The signal observer may be arranged to capture the envelope of the up-converted signal through a branch of an IQ receiver.

A system may include an IQ transmit path comprising an up-converter, an IQ receive path comprising a down-converter, a feedback connection arranged to couple an up-converted signal from the IQ transmit path to the IQ receive path, a signal generator arranged to apply a pilot signal to the IQ transmit path, a signal observer arranged to capture the up-converted signal through the IQ receive path based on the pilot signal, and a processor configured to: estimate one or more IQ mismatch (IQMM) parameters for the IQ transmit path based on the captured up-converted signal, and estimate one or more compensation coefficients for the IQ transmit path based on the estimated IQMM parameters.

BRIEF DESCRIPTION OF THE DRAWINGS

The figures are not necessarily drawn to scale and elements of similar structures or functions are generally represented by like reference numerals for illustrative purposes throughout the figures. The figures are only intended to facilitate the description of the various embodiments disclosed herein. The figures do not describe every aspect of the teachings disclosed herein and do not limit the scope of the claims. The accompanying drawings, together with the specification, illustrate example embodiments of the present disclosure, and, together with the description, serve to explain the principles of the present disclosure.

FIG. 5 illustrates example embodiments of spectral plots of transmitted and captured (observed) signals corresponding to some equations according to this disclosure.

DETAILED DESCRIPTION

Overview

Figure 1:
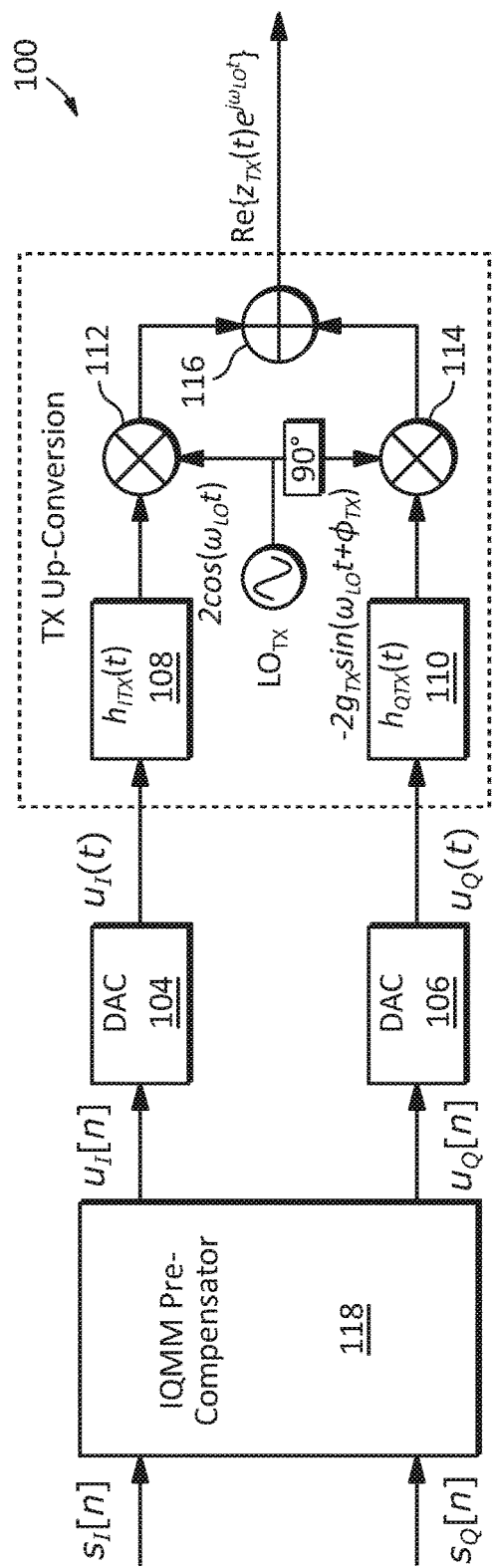
FIG. 1 illustrates an example embodiment of an IQ transmitter that may be used to implement any of the TX IQMM estimation and/or compensation techniques according to this disclosure.

This disclosure encompasses numerous inventive principles relating to pre-compensation for in-phase (I) and quadrature (Q) mismatch (IQMM) in quadrature up-conversion transmitters. Pilot signals may be applied at baseband to a transmit (TX) path, and the IQMM impaired up-converted signals may be captured and processed using various disclosed techniques and algorithms to estimate the TX IQMM, which may include both frequency-independent IQMM (FI-IQMM) and frequency-dependent IQMM (FD-IQMM). The estimated IQMM may then be used to determine coefficients for a pre-compensator in the TX path.

In some embodiments, the IQMM impaired up-converted signals may be captured through a receive (RX) feedback path having a quadrature down-converter. Single-tone pilot signals may be applied at different frequencies, and primary and mirror components of the captured down-converted signals may be used in a system of equations to estimate IQMM parameters for the TX path. Effects of RX IQMM in the RX feedback path may be reduced or eliminated through various disclosed techniques, for example, by using separate local oscillators for the TX and RX paths and/or a frequency shift between the local oscillators for the TX and RX paths.

In some embodiments, the IQMM impaired up-converted signals may be captured through an envelope detector and processed using various disclosed techniques. In a first method using an envelope detector, a single-tone pilot signal may be applied while varying one or more pre-compensation parameters. A single-tone pilot signal applied at baseband may produce a signal at the output of the envelope detector having a component at twice the frequency of the pilot signal if there is IQMM in the TX path. Thus, the first method may sweep one or more pre-compensation parameters while applying a first single-tone pilot signal and selecting one or more of the parameters that provide the lowest output power from the envelope detector at twice the frequency of the pilot signal. A search may be performed by repeating this process at other frequencies to select one or more parameters for each frequency. The selected parameters may then be used to estimate IQMM parameters for the TX path.

In a second method using an envelope detector, one or more TX IQMM parameters for a given frequency may be estimated directly by separately sending the negative and positive frequencies of a single-tone pilot signal at baseband using two different sets of pre-compensator settings. The components at twice the given frequency at the output of the envelope detector may be combined in a set of equations and solved for the frequency-dependent gain and phase mismatch at the given frequency. This process may be repeated to determine the frequency-dependent gain and phase mismatch at other frequencies, which may then be used to estimate the IQMM parameters for the TX path.

In a third method using an envelope detector, various combinations of the negative and positive frequencies of two-tone pilot signals may be applied separately to the TX path at baseband. The outputs of the envelope detector at various frequencies may be combined and solved using a set of equations to obtain estimates of the TX IQMM parameters directly.

Once TX IQMM parameters are determined by any of these disclosed techniques, they may be used to determine coefficients for a pre-compensator in the TX path.

The principles disclosed herein may have independent utility and may be embodied individually, and not every embodiment may utilize every principle. Moreover, the principles may also be embodied in various combinations, some of which may amplify benefits of the individual principles in a synergistic manner.

TX Pre-Compensation

In quadrature up-conversion transmitters. IQMM between the I and Q branches may create interference between the mirror frequencies after up-conversion to radio frequency (RF) or intermediate frequency (IF). Thus, the IQMM may degrade system performance by reducing the effective signal-to-interference-plus-noise ratio (SINR). Frequency-independent IQMM (FI-IQMM) may originate from imbalances at mixers, while frequency-dependent IQMM (FD-IQMM) may be caused by mismatch between overall frequency responses on the I and Q paths. In some embodiments, only frequency-independent IQMM (FI-IQMM) may be compensated. However, in some applications such as wideband systems (e.g., mmWave systems). FI-IQMM compensation alone may not provide adequate performance. Thus, some of the inventive principles of this application relate to techniques for providing FD-IQMM compensation for quadrature up-converter transmitters. Moreover, TX IQMM may be different than RX IQMM. Therefore, in some embodiments, calibration methods for a TX path according to this disclosure may be different than that those for an RX path.

FIG. 1 illustrates an example embodiment of an IQ transmitter that may be used to implement any of the TX IQMM estimation and/or compensation techniques according to this disclosure. The transmitter 100 illustrated in FIG. 1 may include an I signal path including a digital-to-analog converter (DAC) 104, a low-pass filter 108 having an impulse response $h_{ITX}(t)$, and a mixer 112. The transmitter 100, which may also be referred to as a TX path, may also include a Q signal path including a DAC 106, a low-pass filter 110 having an impulse response $h_{QTX}(t)$, and a mixer 114. The mixers 112, 114 and filters 108, 110, along with summing circuit 116, may collectively form an up-converter. The transmitter 100 may further include an IQMM pre-compensator 118.

In the transmitter, $g_{TX} \neq 1$ and $\phi_{TX} \neq 0$ may denote the TX gain and phase mismatches, respectively, that may create frequency-independent IQ mismatch (FI-IQMM) at the transmitter. The mismatch between the overall frequency responses $h_{ITX}(t)$ and $h_{QTX}(t)$ in the I and Q paths of the TX path may create FD-IQMM in the TX path, that is, $h_{ITX}(t) \neq h_{QTX}(t)$.

The baseband equivalent of the upconverted signal in the TX path 100 (at the output of the mixers) in the frequency-domain may be given by $$Z_{TX}(f) = G_{1TX}(f)U(f) + G_{2TX}(f)U^*(-f), \quad (1)$$

where U(f) may be the frequency response of the desired baseband (BB) signal at the input of the analog baseband (ABB) filters 108 and 110 in the TX path, and $G_{1TX}(f)$ and $G_{2TX}(f)$ may be defined as $$G_{1TX}(f) = \frac{H_{ITX}(f) + g_{TX} e^{j\phi_{TX}} H_{QTX}(f)}{2}, \quad (2)$$

$$G_{2TX}(f) = \frac{H_{ITX}(f) + g_{TX} e^{j\phi_{TX}} H_{QTX}(f)}{2}.$$

In Equations (2). $H_{ITX}(f)$ and $H_{QTX}(f)$ may denote the frequency responses of filter 108 ($h_{ITX}(t)$) and filter 110 ($h_{QTX}(t)$), respectively. In Equation (1), $G_{1TX}(f)U(f)$ may represent a desired TX signal, and $G_{2TX}(f)U^*(-f)$ may represent a TX image signal. Without any IQMM, ($g_{TX}=1$, $\phi_{TX}=0$, and $h_{ITX}(t)=h_{QTX}(t)$), $G_{2TX}(f)$, and consequently, the second term in Equation (1) may become zero. Thus, In some embodiments, $G_{1TX}(f)$ may represent a desired frequency response of the transmit path, and $G_{2TX}(f)$ may represent a frequency response of the transmit path due to IQMM.

In some embodiments according to this disclosure, the effects of IQMM in the transmitter 100 may be compensated by estimating one or more IQMM parameters in the transmitter, and then using the estimated IQMM parameters to determine pre-compensation parameters.

The one or more IQMM parameters may include any parameters that may be affected by IQMM in the TX path such as gain mismatch $g_{TX}$, phase mismatch $\phi_{TX}$, filters $h_{ITX}(t)$ and $h_{QTX}(t)$ (and/or their frequency responses $H_{ITX}(f)$ and $H_{QTX}(f)$)–$G_{1TX}(f)$, $G_{2TX}(f)$, $V_{TX}(f)$ (as described below), and/or the like. In some example embodiments described below, the parameters $\phi_{TX}$ and $V_{TX}(f)$ may be used as the IQMM parameters because, for example, they may reduce the complexity and/or effort involved with mathematical derivations. However, other IQMM parameters may be used according to this disclosure. For example, in some example embodiments, $G_{1TX}(f)$ and $G_{2TX}(f)$ may be used as IQMM parameters which may be estimated and then used to determine pre-compensation parameters.

The pre-compensation parameters may be any parameters that may determine how the IQMM pre-compensator 118 may affect the IQMM in the TX path 100. An example of pre-compensation parameters may be coefficients for the IQMM pre-compensator 118 (IQMC coefficients) which may shape the BB signal $s[n]=s_I[n]+js_Q[n]$ so as to reduce or eliminate an image component in the upconverted signal $z_{TX}$ (t). Examples of IQMC coefficients that may be obtained based on estimated IQMM parameters are described below.

In some embodiments, the IQMM parameter $V_{TX}(f)$ mentioned above, which may depend on the TX gain and filter mismatches, may be defined as follows $$V_{TX}(f) \triangleq \frac{H_{ITX}(f)}{g_{TX}H_{QTX}(f)}. \quad (3)$$

Various calibration algorithms described herein may be used to estimate phase mismatch $\phi_{TX}$ and $V_{TX}(f)$ for continuous-time frequencies $f=\pm f_1, \ldots, \pm f_K$ across a desired frequency band. The estimates of $\phi_{TX}$ and $V_{TX}(f)$ may then be used to obtain IQ mismatch compensator (IQMC) coefficients for the pre-compensator 118 to reduce TX FD-IQMM.

Figure 2:
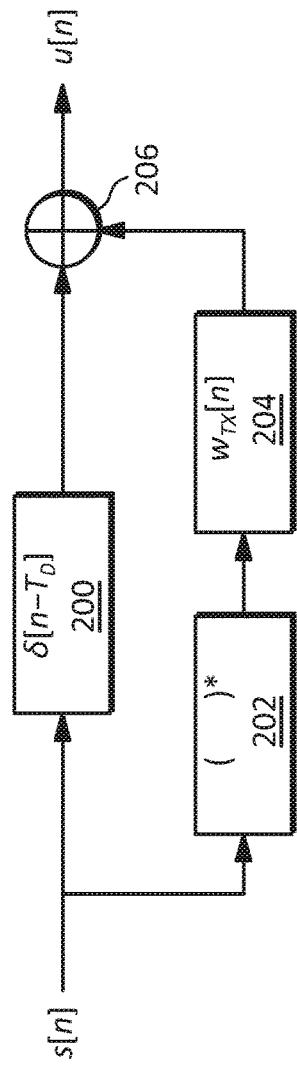
FIG. 2 illustrates an example embodiment of complex-valued pre-compensator (CVC) structure for which coefficients may be estimated according to this disclosure.

FIG. 2 illustrates an example embodiment of a complex-valued pre-compensator (CVC) structure for which coefficients may be estimated according to this disclosure. The embodiment illustrated in FIG. 2 may include an integer delay element 200 having a delay $T_D$, a complex conjugate block 202, a complex-valued filter 204 having an impulse response $w_{TX}[n]$, and a summing circuit 206.

Values for coefficients for the pre-compensator illustrated in FIG. 2, which may fully or partially remove TX FD-IQMM from the transmitter 100 illustrated in FIG. 1, may then be given by $$W_{TX}^{opt}(f) = -\frac{G_{2TX}(f)}{G_{1TX}(f)}e^{-j2\pi fT_D} = \frac{1-V_{TX}(f)e^{-j\phi_{TX}}}{1+V_{TX}(f)e^{-j\phi_{TX}}}e^{-j2\pi fT_D} \quad (4)$$

where $W_{TX}^{opt}(f)$ may denote the frequency response of filter $w_{TX}[n]$. From Equation (4), it may be apparent that optimal responses of IQMC coefficients may involve knowledge of $\phi_{TX}$ and/or $V_{TX}(f)$, which may be estimated, for example, using any of the techniques disclosed herein.

In some embodiments, and depending on the implementation details, the methods, expressions, and/or the like disclosed herein may provide optimal values, and thus, the designator "opt" may be used. However, the inventive principles are not limited to embodiments in which optimal values may be obtained, and the use of "opt" or "optimal" is not limited to methods, expressions, and/or the like that may provide optimal values.

Some example embodiments of the CVC structure illustrated in FIG. 2 may include any of the following implementation details. The complex-valued filter 204 having the impulse response $w_{TX}[n]$ may be implemented, for example, as a finite impulse response (FIR) filter. The complex conjugate block 202 may be configured to output the complex conjugate of the signal $s[n]$ as, for example, $s[n]^*=s_I[n]-js_Q[n]$. The integer delay element 200 having the delay $T_D$ may be configured to create a delay in the input signal as, for example, $s[n-T_D]$.

The CVC structure illustrated in FIG. 2 is provided as an example for purposes of illustrating the inventive principles of this disclosure, but other IQMM pre-compensation structures and/or combinations thereof, may be used. For example, in some embodiments, a real-valued compensator (RVC) architecture may be use.

RX Feedback Path

Figure 3:
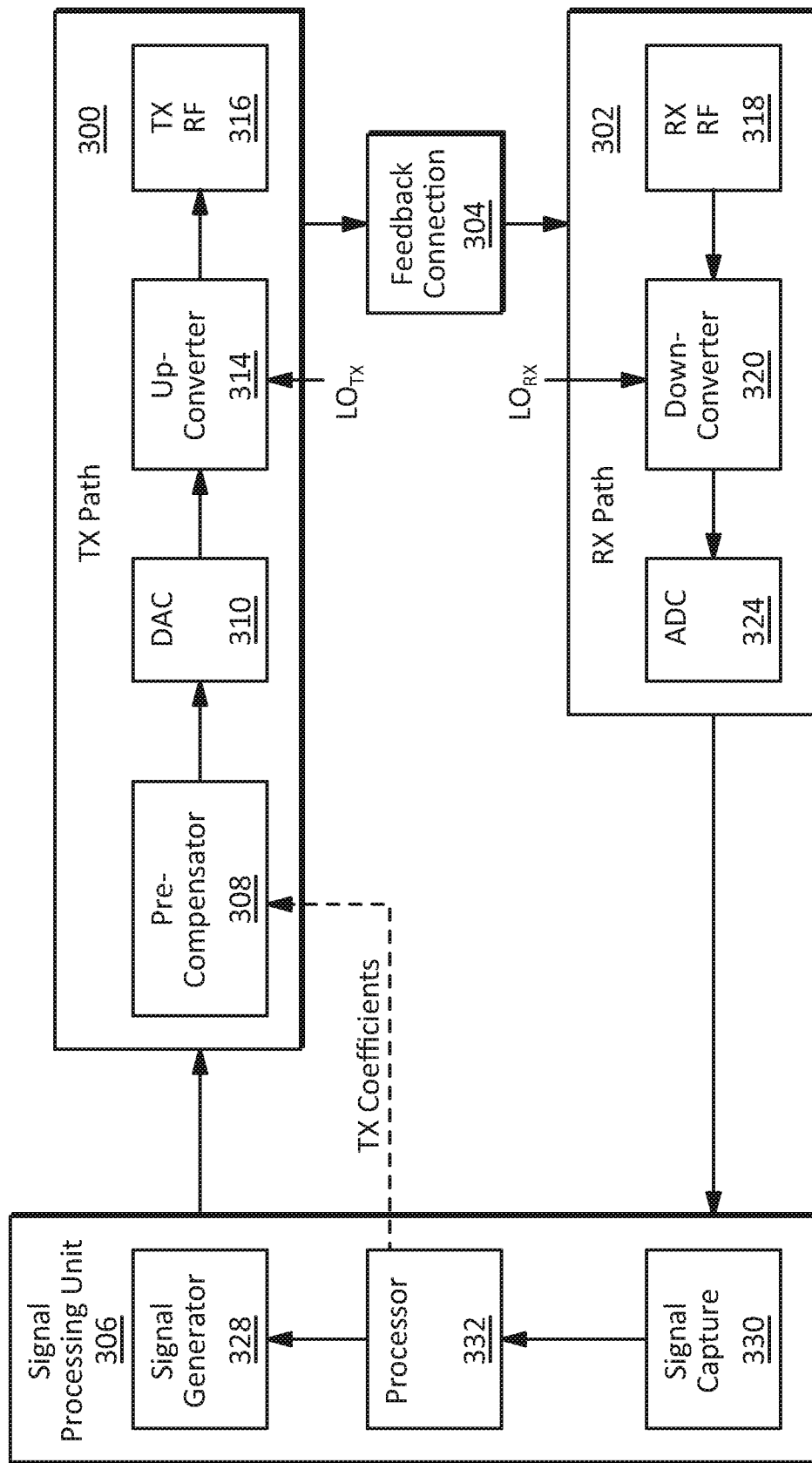
FIG. 3 illustrates an embodiment of a system that may be used to implement TX FD-IQMM calibration using an RX feedback path according to this disclosure.

FIG. 3 illustrates an embodiment of a system that may be used to implement TX FD-IQMM calibration using an RX feedback path according to this disclosure. The embodiment illustrated in FIG. 3 may include a TX path 300, an RX path 302, a feedback connection 304, and a signal processing unit 306. The TX path 300 may include a pre-compensator 308, a digital-to-analog converter (DAC) 310, an up-converter 314, and a radio frequency (RF) transmission block 316. The RX path 302 may include an RF reception block 318, a down-converter 320, and an analog-to-digital converter (ADC) 324. In some embodiments, the RX path 302 may further include a compensator (not shown). The signal processing unit 306 may include a signal generator 328, a signal capture unit 330, and a signal processor 332.

The feedback connection 304 may be implemented with any suitable apparatus such as switches, couplers, conductors, transmission lines, filters, and/or the like. The feedback connection 304 may be coupled to the TX path 300 at any location after the up-converter 314.

The feedback connection 304 may be coupled to the RX path 302 at any location before the down-converter 320. In some embodiments, some or all of the feedback connection 304 may be integral with the TX path 300 and/or the RX path 302.

The TX path 300 and the RX path 302 may each include an I signal path or branch and a Q signal path or branch. The RF transmission block 316 may include various components to transmit an RF signal such as a power amplifier, a band-pass filter, an antenna, and/or the like. The RF reception block 318 may include various components to receive an RF signal such as an antenna, a band-pass filter, a low noise amplifier (LNA) and/or the like. Depending on whether the system is in an operational mode or a calibration mode. IQMM in the TX path 300 may be corrected by the IQMM pre-compensator 308.

In some embodiments, the processor 332 may manage and/or control the overall operation of the system illustrated in FIG. 3. This may include controlling the application of one or more pilot signals to the TX path 300, capturing observations of the up-converted pilot signals through the RX path 302, performing calculations and/or offloading calculations to other resources, providing estimated coefficients to the TX pre-compensator 308, controlling the TX pre-compensator 308 during transmission and/or sending of pilot signals, for example, by disabling the pre-compensator 308, placing it in a transparent or pass-through state, and/or the like.

Although various components illustrated in FIG. 3 may be shown as individual components, in some embodiments, multiple components and/or their functionality may be combined into a smaller number of components. Likewise, a single component and/or its functionality may be distributed among, and/or integrated with, other components. For example, the signal generator 328 and/or signal capture unit 330 may be integrated with, and/or their functions may be performed by, one or more similar components in a modem that may be coupled to the transceiver shown in FIG. 3.

The components of the signal processing unit 306 may be implemented with hardware, software, and/or any combination thereof. For example, full or partial hardware implementations may include combinational logic, sequential logic, timers, counters, registers, gate arrays, amplifiers, synthesizers, multiplexers, modulators, demodulators, filters, vector processors, complex programmable logic devices (CPLDs), field programmable gate arrays (FPGAs), state machines, data converters such as ADCs and DACs, and/or the like. Full or partial software implementations may include one or more processor cores, memories, program and/or data storage, and/or the like, which may be located locally and/or remotely, and which may be programmed to execute instructions to perform one or more functions of the components of the signal processing unit 306.

Figure 4:
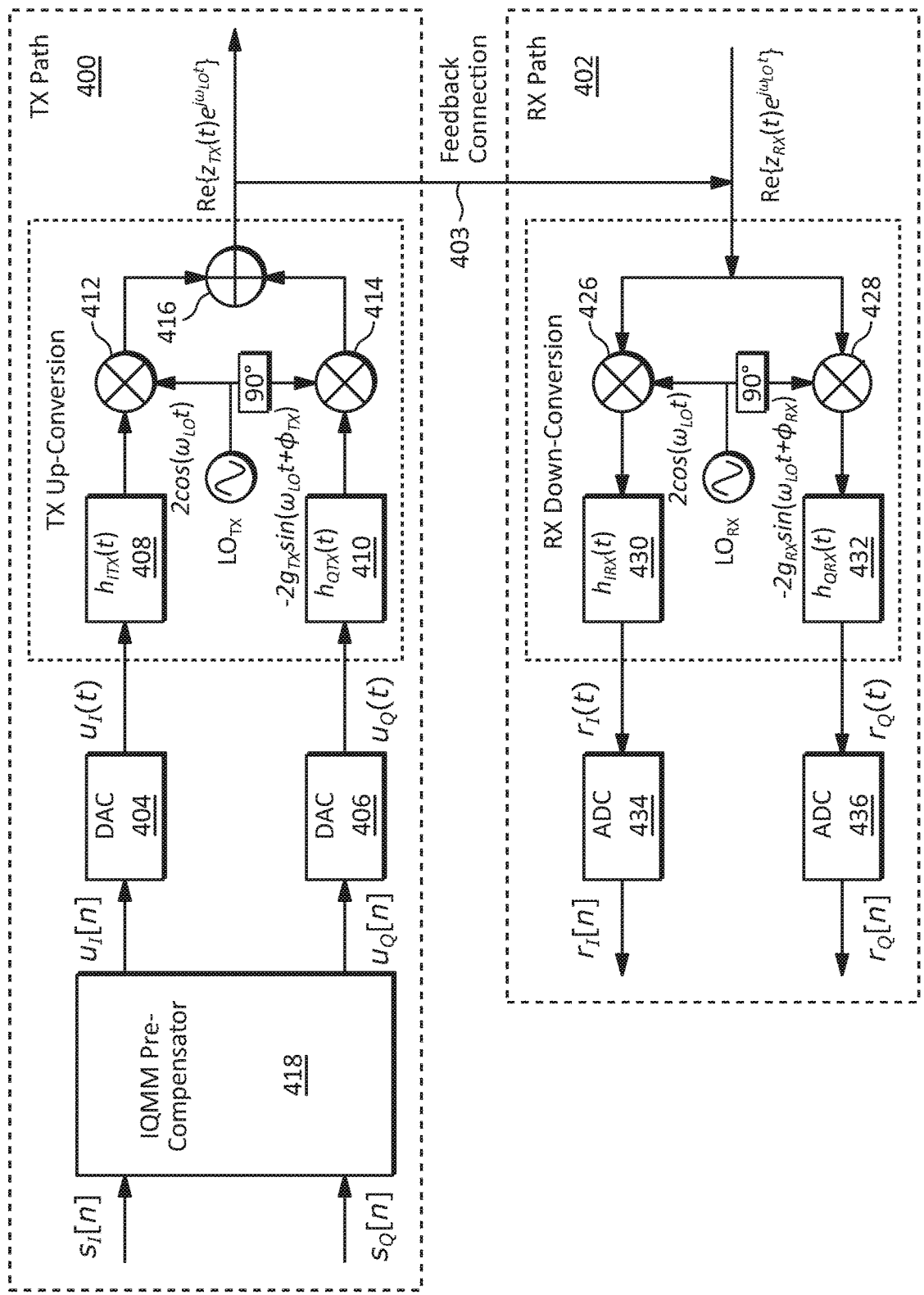
FIG. 4 illustrates an example embodiment of a system that may be used to implement TX FD-IQMM calibration using an RX feedback path according to this disclosure.

FIG. 4 illustrates an example embodiment of a system that may be used to implement TX FD-IQMM calibration using an RX feedback path according to this disclosure. The embodiment illustrated in FIG. 4 may include a TX path 400, an RX path 402, and an RX feedback connection 403. The TX path 400, which may be similar to the transmitter 100 illustrated in FIG. 1, may include an I signal path including a DAC 404, a low-pass filter 408 having an impulse response $h_{ITX}(t)$, and a mixer 412. The TX path 400 may also include a Q signal path including a DAC 406, a low-pass filter 410 having an impulse response $h_{QTX}(t)$, and a mixer 414. The mixers 412 and 414 and filters 408 and 410, along with summing circuit 416, may collectively form an up-converter. The TX path 400 may further include an IQMM pre-compensator 418.

The RX path 402 may include an I signal path including a mixer 426, a low-pass filter 430 having an impulse response $h_{IRX}(t)$, and an ADC 434. The RX path 402 may also include a Q signal path including a mixer 428, a low-pass filter 432 having an impulse response $h_{QRX}(t)$, and an ADC 436. The mixers 426 and 428 and filters 430 and 432 may collectively form a down-converter. In some embodiments, the RX path 402 may further include an IQMM compensator (not shown) which may be disabled or placed in a pass-through state during a calibration operation.

In some embodiments, during a calibration operation. IQMM pre-compensator 418 may be disabled or placed in a pass-through mode such that IQMC may be unity, and therefore U(f)=S(f).

To estimate the IQMM parameters $\phi_{TX}$ and $V_{TX}(f)$, a single-tone signal may be applied at baseband of the TX path 400 at frequency $f_k$, that is, $U(f)=A_{TX}\delta(f-f_k)$ where $A_{TX}$ may be an unknown scaling factor that may account for gain and/or delay of the path between the TX baseband signal generation and the input of the ABB filters 408 and 410. The IQMM impaired up-converted signal may be observed by capturing the frequency response of the down-converted signal through the RX feedback path at the principal and image frequencies ($f_k$ and $-f_k$), which may be denoted by $R_{1,k} \triangleq R(f_k)$ and $R_{2,k} \triangleq R(-f_k)$. Next, a single-tone signal at frequency $-f_k$, that is. $U'(f)=A_{TX}*\delta(f+f_k)$, may be sent through the TX path 400, and the down-converted signal at frequencies $-f_k$ and $f_k$ may be denoted by $R_{3,k}=R'(-f_k)$ and $R_{4,k}=R'(f_k)$, respectively. Collecting all of the observations may provide the following set of equations $$R_{1,k} = A_{TX}A_{RX}G_{1TX}(f_k) \quad (5)$$

$$R_{2,k} = A_{TX}^*A_{RX}G_{2TX}(-f_k)$$

-continued
$$R_{3,k} = A_{TX}^*A_{RX}G_{1TX}(-f_k)$$

$$R_{4,k} = A_{TX}A_{RX}G_{2TX}(f_k)$$

where $A_{RX}$ may denote the gain and/or delay from the RX ABB filters 430 and 432 to the RX BB. In some embodiments, the four Equations (5) may be time-aligned for correct estimation of IQMM parameters.

FIG. 5 illustrates example embodiments of spectral plots of transmitted and captured (observed) signals corresponding to the Equations (5).

The single-tone signal (e.g., $f_k$) may be swept across the channel band for all selected frequencies to obtain estimates of $\phi_{TX}$ and $V_{TX}$ (f) using Equations (5) as follows $$\hat{\phi}_{TX} = \frac{1}{2K}\sum_{k=1}^{K}\text{angle}\left(\frac{T^*(-f_k)}{T(f_k)}\right), \quad (6)$$

$$\hat{V}_{TX}(f) = T(f)e^{+j\hat{\phi}_{TX}}, f = \pm f_1, \ldots, \pm f_K$$

where $$T(f_k) = \frac{R_{1,k} + R_{4,k}^*}{R_{1,k} - R_{4,k}^*}, \quad T(-f_k) = \frac{R_{3,k} + R_{2,k}^*}{R_{3,k} - R_{2,k}^*}, \quad k = 1, \ldots K. \quad (7)$$

In some implementations of the calibration algorithm described above, the IQMM at the RX feedback path may be assumed to be zero. In some other implementations, the RX feedback path may introduce RX IQMM into the observations as well, which may degrade the estimation accuracy of the TX IQMM parameters.

In some embodiments, either or both of the two techniques described below may reduce or eliminate the effects of IQMM in the RX feedback path on observations of up-converted pilot signals according to this disclosure.

In a first technique according to this disclosure, RX FD-IQMC may be calibrated using separate local oscillators (LOs) for the TX and RX paths in loopback mode (e.g., sweeping the TX LO and using a DC tone at BB of the TX path while keeping RX LO fixed). Next, BB TX tones may be swept across frequency keeping both the TX LO and RX LO fixed at the same frequency. The TX FD-IQMC coefficients may then be determined. In some embodiments, an additional step may be added to post-process the received signal R(f) to remove the effect of RX-IQMM before estimation of $\phi_{TX}$ and $V_{TX}(f)$.

In a second technique according to this disclosure, a frequency shift may be created between the LOs of the TX and RX paths such that the RX-IQMM may not interfere with the principal and mirror signals of the TX path. In some embodiments, the frequency shift between the LOs may be kept relatively small, for example, to preserve the approximate symmetry of the ABB filter response that the TX principal and image signals may observe.

Envelope Detector

Figure 6:
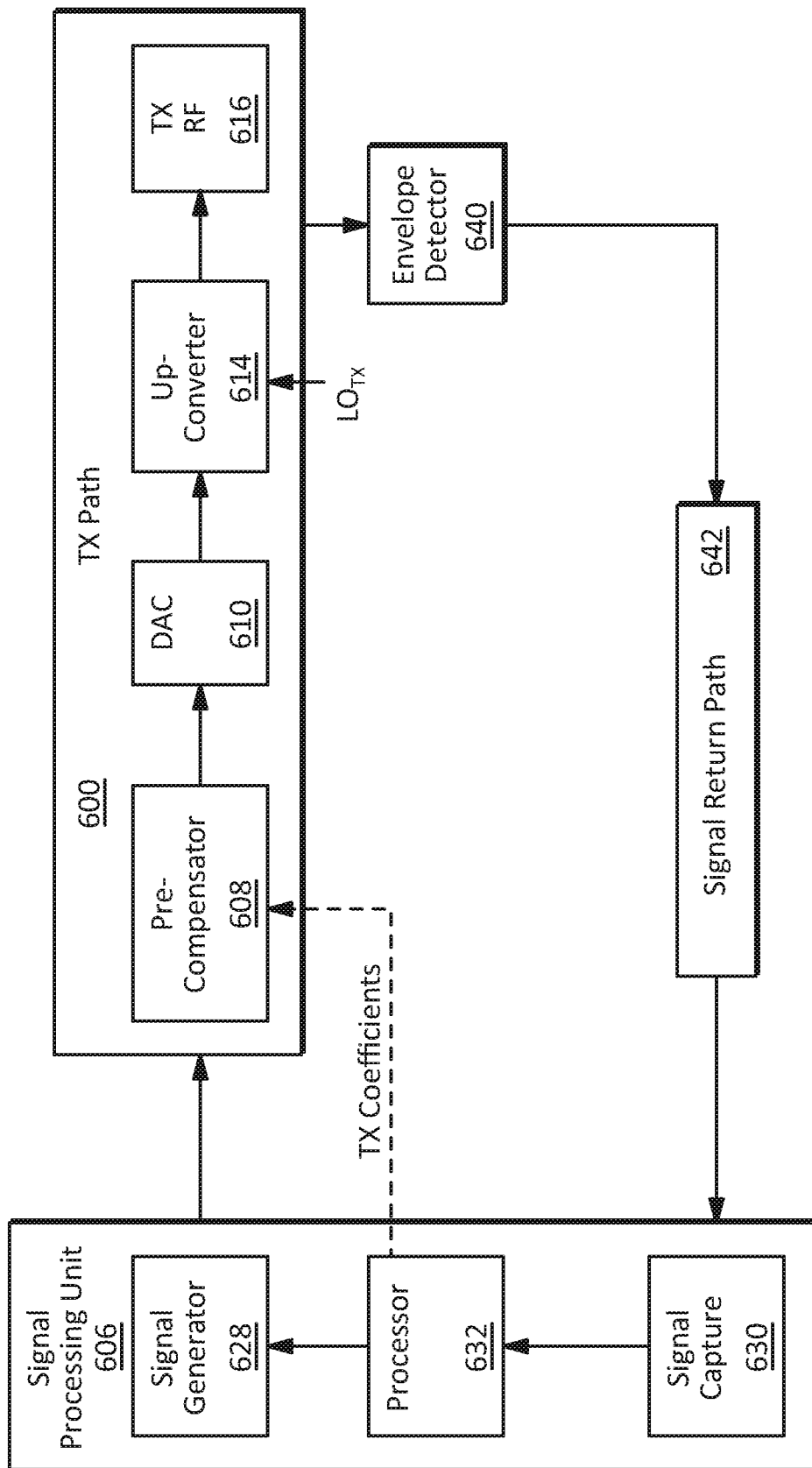
FIG. 6 illustrates an embodiment of a system that may be used to implement TX FD-IQMM calibration using an envelope detector according to this disclosure.

FIG. 6 illustrates an embodiment of a system that may be used to implement TX FD-IQMM calibration using an envelope detector according to this disclosure. The system illustrated in FIG. 6 may include a TX path 600 and a signal processing unit 606 that may be constructed and/or operate in a manner similar to those illustrated in FIG. 3. Specifically, the TX path 600 may include a pre-compensator 608, a digital-to-analog converter (DAC) 610, an up-converter 614, and a radio frequency (RF) transmission block 616. The signal processing unit 606 may include a signal generator 628, a signal capture unit 630, and a signal processor 632.

The system illustrated in FIG. 6 may further include an envelope detector 640 and a signal return path 642. The envelope detector 640, which may be implemented using any suitable apparatus including diodes, filters, and/or the like, may be coupled to the TX path 600 at any location after the up-converter 614. The return signal path 642 may include any suitable apparatus such as switches, couplers, conductors, transmission lines, filters, data converters, and/ or the like.

In some embodiments, the envelope detector 640 may provide an output having a form, for example, of $y(t)=|z(t)|^2$. In some embodiments, some or all of the envelope detector 640 may be integral with the TX path 600.

In some embodiments, the 640 envelope detector may output the envelope of the IQMM impaired up-converted signal and feed it back to the signal processing unit 606 without going through a mixer. Thus, the captured signal may only contain TX IQMM without any RX impairments. Although the return signal path 642 is not limited to any specific implementation details, in some embodiments, either the I or Q signal path downstream of a multiplier in a quadrature receiver may be used as the return signal path. This may be convenient, for example, in a transceiver system in which the RX path already exists.

Figure 7:
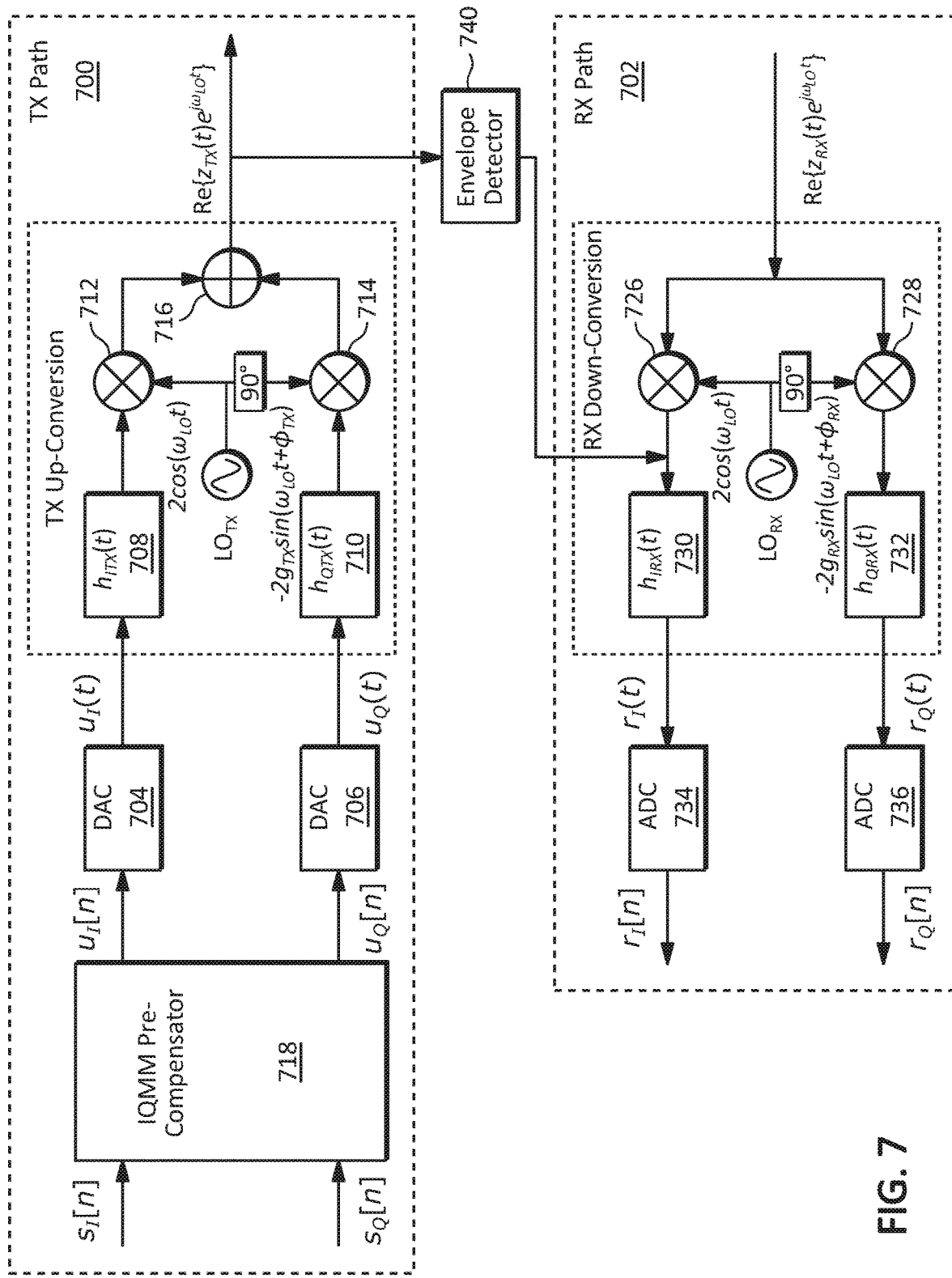
FIG. 7 illustrates an example embodiment of a system that may be used to implement TX FD-IQMM calibration using an envelope detector according to this disclosure.

FIG. 7 illustrates an example embodiment of a system that may be used to implement TX FD-IQMM calibration using an envelope detector according to this disclosure. The system illustrated in FIG. 7 may include a TX path 700, an RX path 702, and an envelope detector 740.

The TX path 700, which may be similar to the TX path 400 illustrated in FIG. 4, may include an I signal path including a DAC 704, a low-pass filter 708 having an impulse response $h_{ITX}(t)$, and a mixer 712. The TX path 700 may also include a Q signal path including a DAC 706, a low-pass filter 710 having an impulse response $h_{QTX}(t)$, and a mixer 714. The mixers 712 and 714 and filters 708 and 710, along with summing circuit 716, may collectively form an up-converter. The TX path 700 may further include an IQMM pre-compensator 718.

The RX path 702, which may be similar to the RX path 402 illustrated in FIG. 4, may include an I signal path including a mixer 726, a low-pass filter 730 having an impulse response $h_{IRX}(t)$, and an ADC 734. The RX path 702 may also include a Q signal path including a mixer 728, a low-pass filter 732 having an impulse response $h_{QRX}(t)$, and an ADC 736. The mixers 726 and 728 and filters 730 and 732 may collectively form a down-converter. In some embodiments, the RX path 702 may further include an IQMM compensator which may be disabled or placed in a pass-through state during a calibration operation.

The envelope detector 740 may be connected to the TX path 700 at any location after the up-conversion unit. It may also be connected to the RX path 702 at any location after the mixers 726 and 728. In the embodiment illustrated in FIG. 7, the envelope detector 740 is connected to the I path of the RX path, but it may be connected to the Q side as well.

Embodiments of three different methods of estimating TX IQMM using an envelope detector are described below in the context of the example embodiment illustrated in FIG. 7.

These methods, however, are not limited to these or any other system implementation details.

Method 1

In some embodiments, this method may seek to obtain single-tap pre-compensator filter coefficients that may cancel IQMM at frequencies $\pm f_1, \ldots, \pm f_K$. These coefficients may then be used to estimate IQMM parameters $\phi_{TX}$ and $V_{TX}(f)$.

Figure 8:
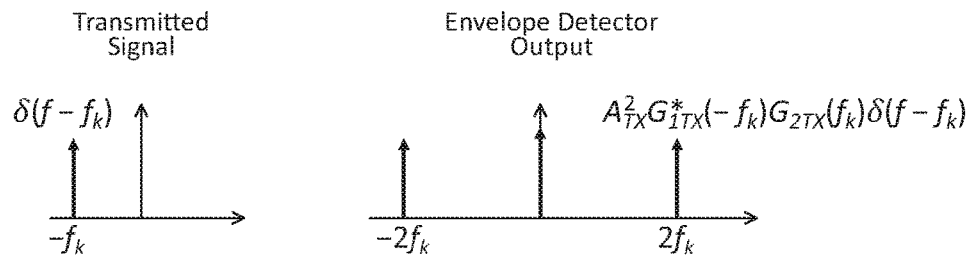
FIG. 8 illustrates some spectral plots of transmitted and captured (observed) signals using a first embodiment of a method for TX IQMM calibration using an envelope detector according to this disclosure.

Referring to FIG. 8, in some embodiments, a single-tone signal at frequency $-f_k$ sent at baseband may produce an output at the envelope detector having a component at frequency $2f_k$ if there is any IQMM in the TX chain. Therefore, single-tap pre-compensator coefficients (in some implementations, the best or optimal coefficients) for frequency $f_k$ may be found by sending a single-tone signal from baseband of TX at frequency $-f_k$, sweeping pre-compensator coefficients (in some implementations one tap may be adequate) and choosing the coefficients that may provide the lowest power at the output of the envelope detector at twice the frequency of the BB signal. i.e., $2f_k$. For a single-tone signal sent at frequency $-f_k$, the output of the envelope detector path may be denoted by r(t), and its response (ignoring higher frequency components) may be given by:

$$r(t) = \left|Re\{z_{TX}(t)e^{j\omega_{LO_{TX}}t}\}\right|^2 = |A_{TX}G_{1TX}(-f_k)|^2 + \tag{8}$$
$$|A_{TX}^*G_{2TX}(f_k)|^2 + 2Re\{A_{TX}^2 G_{1TX}^*(-f_k)G_{2TX}(f_k)e^{-j2\pi 2f_k t}\}.$$

The frequency response of the envelope detector output at frequency $2f_k$ may be given by $$R(f)|_{f=2f_k} = A_{TX}^2 G_{1TX}^*(-f_k)G_{2TX}(f_k). \tag{9}$$

In the absence of IQMM, $G_{2TX}(f_k)$ may be zero and thus $R(2f_k)$ in Equation (9) may become zero. By performing a search of pre-compensator coefficients, one-tap pre-compensator settings. i.e., $w_{TX}[n]=w_{TX,0}\times\delta[n]$, may be obtained such that $R(2f_k)$ may become zero and cancel IQMM at frequency $f_k$. After sweeping $f_k$ and obtaining the IQMC coefficients (e.g., optimal coefficients) over all frequency tones denoted by $w_{TX,0}^{opt}(f)$ for $T_D=0$, then $\phi_{TX}$ and $V_{TX}(f)$ may be estimated as follows for a CVC structure $$\hat{\phi}_{TX} = \frac{1}{2K}\sum_{k=1}^{K} angle\left(\frac{1+w_{TX,0}^{opt}(f_k)}{1+w_{TX,0}^{opt*}(-f_k)} \times \frac{1-w_{TX,0}^{opt*}(-f_k)}{1-w_{TX,0}^{opt}(f_k)}\right), \tag{10}$$

$$\hat{V}_{TX}(f) = \frac{1-w_{TX,0}^{opt}(f)}{1+w_{TX,0}^{opt}(f)}e^{j\hat{\phi}_{TX}}, \quad f = \pm f_1, \ldots, \pm f_k.$$

In some embodiments, a search of pre-compensator coefficients may be implemented as an extensive or exhaustive search. For example, a search may be conducted over a wide range of pre-compensator settings and/or frequency tones at fixed intervals. In some embodiments, a search may be performed in stages. For example, an initial search may be conducted on a relatively coarse grid of pre-compensator settings and/or frequency tones over a wide range at wider intervals. One or more additional searches may then be performed on a finer grid at smaller intervals over one or more smaller ranges based on the results of the coarse search.

Method 2

In some embodiments, this method may estimate the IQMM parameters for a given frequency $f_k$ directly, for example, by sending single-tone signals at $f_k$ and $-f_k$ separately using two different pre-compensator coefficients and/or settings. The envelope detector outputs at frequency $2f_k$ for these measurements may then be combined and solved using, for example, a quadratic equation in closed form to obtain the frequency-dependent gain and phase mismatches at $f_k$. Then the IQMM parameters $\phi_{TX}$ and $V_{TX}(f)$ may be found, for example, as simple functions of the frequency-dependent gain and phase mismatches for each frequency $f_k$.

Some example implementation details may be as follows. A single-tone signal at frequencies $f_k$ and $-f_k$ may be applied separately at BB to a TX path without any IQMC. e.g., $w_{TX}[n]=0$, for the CVC architecture illustrated in FIG. 2, and the frequency response of the envelope detector output at frequency $2f_k$ may be denoted by $Y_{1,k}$ and $Y_{2,k}$ respectively. Another set of pre-compensation parameters w[n] with a delay element of $T_D=0$ may be chosen and applied, and a single-tone signal at frequency $f_k$ may be sent. The frequency response of the envelope detector output at frequency $2f_k$ may be denoted by $Y_{3,k}$. This may result in the following equations $$Y_{1,k} = A_{TX}^2 G_{1TX}(f_k) G_{2TX}^*(-f_k), \quad (11)$$

$$Y_{2,k} = A_{TX}^2 G_{1TX}^*(-f_k) G_{2TX}(f_k),$$

$$Y_{3,k} = \frac{A_{TX}^2}{4}[G_{1TX}(f_k) G_{2TX}^*(-f_k) J_1^2 + G_{2TX}(f_k) G_{1TX}^*(-f_k) J_2^2 +$$

$$(G_{1TX}(f_k) G_{1TX}^*(-f_k) + G_{2TX}(f_k) G_{2TX}^*(-f_k)) J_1 J_2]$$

where $J_1$ and $J_2$ may be known values that may be defined as follows $$J_1 = 1, \quad (12)$$

$$J_2 = W_{TX}^*(-f_k).$$

Equations (11) may be reformulated using the relationship $V_{TX}(f_k)=V_{TX}(-f_k)$ and Equations (2) and (3) as $$Y_{1,k} = \gamma(V_{TX}(f_k) + e^{j\phi_{TX}})(V_{TX}(f_k) - e^{-j\phi_{TX}}), \quad (13)$$

$$Y_{2,k} = \gamma(V_{TX}(f_k) + e^{-j\phi_{TX}})(V_{TX}(f_k) - e^{j\phi_{TX}}),$$

$$Y_{3,k} =$$

$$\frac{\gamma}{4}\Big[J_1^2 Y_{1,k} + J_2^2 Y_{1,k} + \frac{J_1 J_2}{4}((V_{TX}(f_k) + e^{j\phi_{TX}})(V_{TX}(f_k) + e^{-j\phi_{TX}}) +$$

$$(V_{TX}(f_k) - e^{j\phi_{TX}})(V_{TX}(f_k) - e^{-j\phi_{TX}}))\Big],$$

where $\gamma = A_{TX}^2/(4gH_{QTX}(f))$.

Equations (13) may provide six real equations with five real unknowns, i.e., $\text{Re}\{\gamma\}$, $\text{Im}\{\gamma\}$, $\text{Re}\{V_{TX}(f_k)\}$, $\text{Im}\{V_{TX}(f_k)\}$, $\phi_{TX}$ which may be solved to obtain estimates of $V_{TX}(f_k)$ and $\phi_{TX}$. IQMM parameter $V_{TX}(-f_k)$ may be estimated as $\hat{V}_{TX}(-f_k) = \hat{V}_{TX}^*(f_k)$, which may follow from $h_{ITX}(t)$ and $h_{QTX}(t)$ being real-valued filters that may be conjugate symmetric in the frequency domain. i.e., $H_{ITX}(f) = H_{ITX}^*(-f)$ and $H_{QTX}(f) = H_{QTX}^*(-f)$.

Method 3

In some embodiments, this method may involve sending two-tone pilot signals at frequencies $f_{k_1}$, $f_{k_2}$ and $-f_{k_1}$, $-f_{k_2}$ and $f_{k_1}$, $-f_{k_2}$ separately. The envelope detector outputs for these measurements at frequencies $2f_{k_1}$, $2f_{k_2}$, $f_{k_1} \pm f_{k_2}$ may then be combined and solved in closed form, for example, using two quadratic equations to obtain estimates of $\phi_{TX}$ and $V_{TX}(f)$ at $f = \pm f_{k_1}$, $\pm f_{k_2}$ directly.

Figure 9:
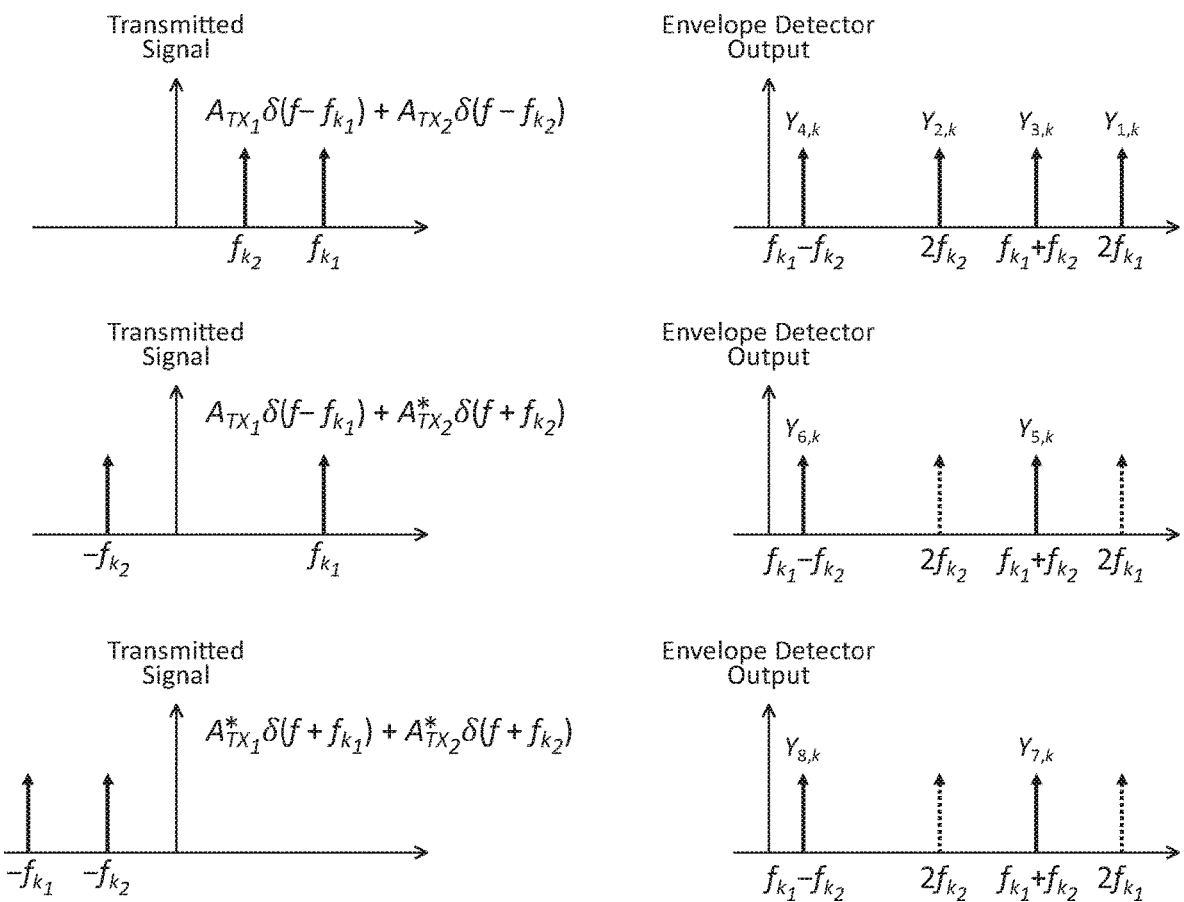
FIG. 9 illustrates some spectral plots of transmitted and captured (observed) signals using a third embodiment of a method for TX IQMM calibration using an envelope detector according to this disclosure.

Referring to FIG. 9, in some embodiments of this method, a two-tone signal at frequencies $f_{k_1}$, $f_{k_2}$ may be generated and sent at TX baseband, i.e., $S(f) = A_{TX_1}\delta(f-f_{k_1}) + A_{TX_2}\delta(f-f_{k_2})$, and the time-domain signal may be captured at the output of the envelope detector. The frequency response of the time-domain signal may be denoted as $$Y_{1,k} = R(f)|_{f=2f_{k_1}}, \; Y_{2,k} = R(f)|_{f=2f_{k_2}}, \; Y_{3,k} = R(f)|_{f=f_{k_1}+f_{k_2}},$$

$$Y_{4,k} = R(f)|_{f=f_{k_1}-f_{k_2}}.$$

Next, a multi-tone signal may be sent at frequencies $f_k$, and $-f_{k_2}$. i.e., $S(f) = A_{TX_1}\delta(f-f_{k_1}) + A_{TX_2}^*\delta(f+f_{k_2})$, and the frequency responses of the envelope detector output at frequencies $f_{k_1} \pm f_{k_2}$ may be denoted as $$Y_{5,k} = R(f)|_{f=f_{k_1}+f_{k_2}}$$

and $$Y_{6,k} = R(f)|_{f=f_{k_1}-f_{k_2}}.$$

Then, a multi-tone signal may be sent at frequencies $-f_{k_1}$ and $-f_{k_2}$. i.e., $S(f) = A_{TX_1}^*\delta(f+f_{k_1}) + A_{TX_2}^*\delta(f+f_{k_2})$, and the captured frequency response of the envelope signal at frequencies $f_{k_1} \pm f_{k_2}$ may be denoted as $$Y_{7,k} = R(f)|_{f=f_{k_1}+f_{k_2}}$$

and $$Y_{8,k} = R(f)|_{f=f_{k_1}-f_{k_2}}.$$

The following parameters may be defined:

$$x_1 = A_{TX_1} G_{1TX}(f_{k_1}), \quad x_2 = A_{TX_1} G_{1TX}^*(-f_{k_1}), \quad (14)$$

$$y_1 = A_{TX_1} G_{2TX}^*(-f_{k_1}), \quad y_2 = A_{TX_1} G_{2TX}(f_{k_1}),$$

$$z_1 = A_{TX_2} G_{1TX}(f_{k_2}), \quad z_2 = A_{TX_2} G_{1TX}^*(-f_{k_2}),$$

$$w_1 = A_{TX_2} G_{2TX}^*(-f_{k_2}), \quad w_2 = A_{TX_2} G_{2TX}(f_{k_2}).$$

Combining all of the observations may provide the following set of non-linear equations:

$$Y_{1,k} = x_1 y_1, \quad (15)$$

$$Y_{2,k} = z_1 w_1,$$

$$Y_{3,k} = x_1 w_1 + y_1 z_1,$$

$$Y_{4,k} = x_1 z_1^* + y_1 w_1^*,$$

-continued $$Y_{5,k} = x_1 z_2 + y_1 w_2,$$
$$Y_{6,k} = x_1 w_2^* + y_1 z_2^*,$$
$$Y_{7,k} = x_2 w_2 + y_2 z_2,$$
$$Y_{8,k} = x_2 z_2^* + y_2 w_2^*.$$

This set of 8 equations with 8 unknowns in Equations (15) may be solved, for example, using the following steps:

1.
   a. The following parameters may be calculated for l=1,2 and i=1,2

$$\beta_{1,l} = \frac{Y_{3,k} + (-1)^l \sqrt{Y_{3,k}^2 - 4Y_{1,k}Y_{2,k}}}{2},$$

$$\beta_{2,i} = \frac{Y_{4,k} + (-1)^i \sqrt{Y_{4,k}^2 - 4Y_{1,k}Y_{2,k}^*}}{2Y_{2,k}^*}$$

b. $\hat{x}_1$, $\hat{y}_1$, $\hat{z}_1$, and $\hat{w}_1$ may be calculated as $$\hat{x}_1 = \sqrt{|\beta_{1,l_k}\beta_{2,i_k}^*|}, \quad \hat{w}_1 = \frac{\beta_{1,l_k}}{\hat{x}_1}, \quad \hat{y}_1 = \frac{Y_{1,k}}{\hat{x}_1}, \quad \hat{z}_1 = \frac{Y_{2,k}}{\hat{w}_1}$$

where $$i_k = \operatorname*{argmax}_i(|\beta_{2,i}|)$$

and $$l_k = \operatorname*{argmin}_l(Im\{|\beta_{1,l}\beta_{2,i_k}^*|\})$$

c. $\hat{x}_2$, $\hat{y}_2$, $\hat{z}_2$ and $\hat{w}_2$ may be calculated as $$\begin{bmatrix} \hat{z}_2 \\ \hat{w}_2 \end{bmatrix} = \begin{bmatrix} \hat{x}_1 & \hat{y}_1 \\ \hat{y}_1^* & \hat{x}_1^* \end{bmatrix}^{-1} \begin{bmatrix} Y_{5,k} \\ Y_{6,k} \end{bmatrix}, \quad \begin{bmatrix} \hat{x}_2 \\ \hat{y}_2 \end{bmatrix} = \begin{bmatrix} \hat{w}_2 & \hat{z}_2 \\ \hat{z}_2^* & \hat{w}_2^* \end{bmatrix}^{-1} \begin{bmatrix} Y_{7,k} \\ Y_{8,k} \end{bmatrix}$$

d. $T_{k_r}$ and $T_{-k_r}$ may be calculated as $$T_{k_1} \triangleq \frac{\hat{x}_1 + \hat{y}_2}{\hat{x}_1 - \hat{y}_2}, \quad T_{-k_1} \triangleq \frac{\hat{x}_2^* + \hat{y}_1^*}{\hat{x}_2^* - \hat{y}_1^*}, \quad T_{k_2} \triangleq \frac{\hat{z}_1 + \hat{w}_2}{\hat{z}_1 - \hat{w}_2}, \quad T_{-k_2} \triangleq \frac{\hat{z}_2^* + \hat{w}_1^*}{\hat{z}_2^* - \hat{w}_1^*}$$

2. After obtaining all $T_{k_1}$, $T_{k_2}$, $T_{-k_1}$, and $T_{-k_2}$ where $k \in \{1, \ldots, K/2\}$
   a. $\phi_{TX}$ may be estimated as $$\hat{\phi}_{TX} = \frac{1}{2K} \sum_{k=1}^{K/2} \left( \operatorname{angle}\left(\frac{T_{-k_1}^*}{T_{k_1}}\right) + \operatorname{angle}\left(\frac{T_{-k_2}^*}{T_{k_2}}\right) \right)$$

b. Estimates of $V_{TX}(f)$ may be obtained as follows
   $\hat{V}_{TX}(f_{k_r}) = T_{k_r} e^{j\hat{\phi}_{TX}}$, $\hat{V}_{TX}(-f_{k_r}) = T_{-k_r} e^{j\hat{\phi}_{TX}}$, for $r=1,2$.

In some embodiments, $f_{k_1} > 0$ and $f_{k_2} > 0$ may be chosen such that the frequencies $2f_{k_1}$, $2f_{k_2}$, $f_{k_1} + f_{k_2}$, and $|f_{k_1} - f_{k_2}|$ may be distinct.

The selection of two-tone pilot signals (and positive and negative frequencies thereof), as well as the resulting envelope detector output signals selected for analysis are for purposes of illustration only, and other combinations of pilot signals and/or output signals may be used. For example, in the second set of signals in FIG. 9, $-f_{k_1}$ and $f_{k_2}$ may be used instead of $f_{k_1}$ and $-f_{k_2}$. Some unused signals are shown with dotted lines in FIG. 9, but in other embodiments, these signals may be used while others may be unused. Although some embodiments may be described in the context of two-tone pilot signals, pilot signals with any number of tones may be used, e.g., three-tone, four-tone, etc.

As described above, in some embodiments, one or more of the equations that may be obtained using method 3 may include one or more IQMM parameters of the two frequencies of a two-tone signal. In contrast, in some embodiments using method 2, each equation may only contain the IQMM of a single-frequency. Thus, in some embodiments, and depending on the implementation details, different sets of equations may be obtained using different methods.

Obtaining IQMC Coefficients

In some embodiments, after obtaining estimates of $\phi_{TX}$ and $V_{TX}(f)$ for $f = \pm f_1, \ldots, \pm f_K$, these estimates may be used to compensate for FD-IQMM in the TX path. In some example embodiments, a least squares (LS) method may be implemented as follows: for a given delay element $T_D$, the parameter $W_{TX}^{opt}(f)$ given in Equation (4) may be estimated at frequencies $f = \pm f_1, \ldots, \pm f_K$. For example, in an embodiment having a finite impulse response (FIR) filter $$w_{TX}[n] = \sum_{i=0}^{L-1} w_{TX,i} \delta[n-i]$$

of length L, the method may obtain the optimal L-tap filter $w_{TX} = [w_{TX,0}, \ldots, w_{TX,L-1}]^T \in \mathbb{C}^{L \times 1}$ that may minimize the least squared (LS) error between $W_{TX}(f)$ and $\hat{W}_{TX}^{opt}(f)$ at frequencies $f = \pm f_1, \ldots, \pm f_K$ as $$\min_{w_{TX}, T_D} \|\hat{W}_{opt} - F w_{TX}\|^2, \tag{16}$$

where $\hat{W}_{opt} = [\hat{W}_{TX}^{opt}(-f_K), \ldots, \hat{W}_{TX}^{opt}(-f_1), \hat{W}_{TX}^{opt}(f_1), \ldots, \hat{W}_{TX}^{opt}(f_K)]^T$ and $F = [F_0, \ldots, F_{L-1}]$ is the discrete Fourier transform (DFT) matrix of size $2K \times L$. In some embodiments, $T_D$ may take values in $\{0, \ldots, L-1\}$. For a fixed $T_D$, $w_{TX}$ may be found as $\hat{w}_{TX,T_D} = \text{pinv}(F)\hat{W}_{opt}$ with a least squared error of $LSE_{T_D} = \|\hat{W}_{opt} - F\hat{w}_{TX,T_D}\|^2$. Then the optimal $T_D$ and filter coefficients $\hat{w}_{TX}^{opt}$ may be given by $$T_D^{opt} = \operatorname*{argmin}_{T_D} LSE_{T_D}, \quad \hat{w}_{TX}^{opt} = \hat{w}_{TX, T_D^{opt}}. \tag{17}$$

Although some techniques have been described in the context of pre-compensator structures such as the one illustrated in FIG. 2, the inventive principles are not limited to these examples, and calibration algorithms according to this disclosure may be applied to other IQMC structures as well.

Furthermore, techniques other than LS may be used to obtain filter coefficients for IQMC structures based on estimated IQMM parameters, and the methodologies described here are only examples for illustrating the inventive principles.

In any of the embodiments disclosed herein, frequency domain signals (e.g., signals $R_{1,k}, \ldots, R_{4,k}$ in FIG. 10) may be obtained by capturing the baseband time-domain signal and converting it to a frequency-domain signal using a fast Fourier transform (FFT) as an example.

Figure 10:
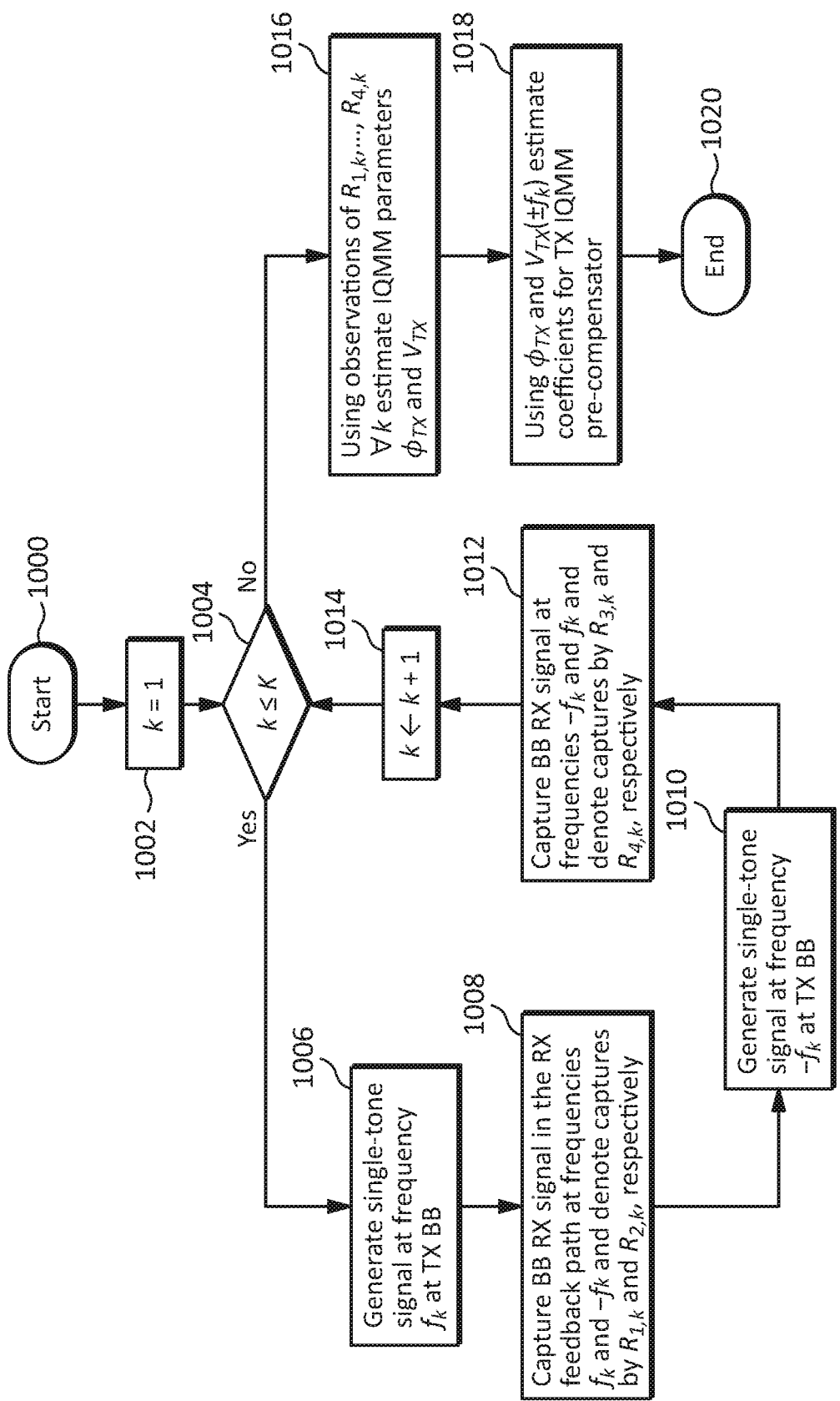
FIG. 10 illustrates an embodiment of method for TX IQMM calibration using an RX feedback path according to this disclosure.

FIG. 10 illustrates an embodiment of method for TX IQMM calibration using an RX feedback path according to this disclosure. The method illustrated in FIG. 10 may be used, for example, with the system illustrated in FIG. 4. The method illustrated in FIG. 10 may begin at operation 1000. At operation 1002, a counter k may be initialized to 1. At operation 1004, the method may check the value of the counter k. If k is less than or equal to the maximum value K, the method may proceed to operation 1006 where a single-tone pilot signal may be generated at frequency $f_k$ and applied at baseband to the TX path 400. At operation 1008, the received pilot signal may be captured at frequencies $f_k$ and $-f_k$ at baseband of the RX path 402 and denoted by $R_{1,k}$ and $R_{2,k}$, respectively. At operation 1010, a single-tone pilot signal may be generated at frequency $-f_k$ and applied at baseband to the TX path 400. At operation 1012, the received pilot signal may be captured at frequencies $-f_k$ and $f_k$ at baseband of the RX path 402 and denoted by $R_{3,k}$ and $R_{4,k}$, respectively.

At operation 1014, the method may increment the value of the counter k and return to operation 1004, where the method may check the value of the counter k. If k is greater than the maximum value K, the method may proceed to operation 1016 where, using the observations for $R_{1,k}, \ldots, R_{4,k}, \forall k$, the method may estimate the IQMM parameters $\phi_{TX}$ and $V_{TX}(f)$, $f=\pm f_1, \ldots, \pm f_K$. At operation 1018, the method may use $\phi_{TX}$ and $V_{TX}(f)$, $f=\pm f_1, \ldots, \pm f_K$ to estimate coefficients for the TX IQMM pre-compensator 418. The method may then terminate at operation 1020.

As mentioned above, in some embodiments, $R_{1,k}, \ldots, R_{4,k}$ may be obtained by capturing the time-domain signal at BB of the RX path 402 and converting it to a frequency-domain signal, for example, using an FFT.

Figure 11:
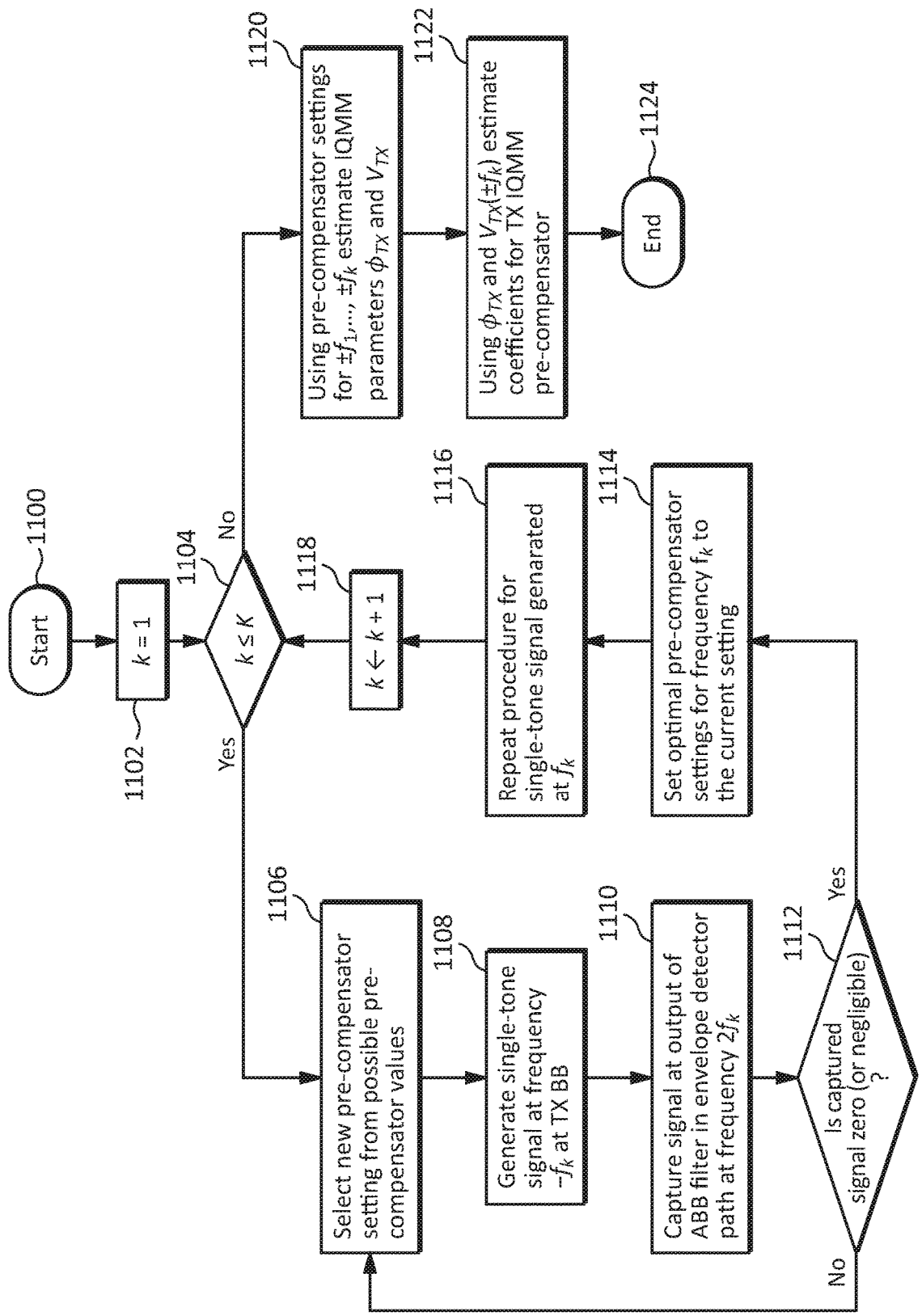
FIG. 11 illustrates an embodiment of a first method for TX IQMM calibration using an envelope detector according to this disclosure.

FIG. 11 illustrates an embodiment of a first method for TX IQMM calibration using an envelope detector according to this disclosure. The method illustrated in FIG. 11 may be used, for example, with the system illustrated in FIG. 7. The method illustrated in FIG. 11 may begin at operation 1100. At operation 1102, a counter k may be initialized to 1. At operation 1104, the method may check the value of the counter k. If k is less than or equal to the maximum value K, the method may proceed to operation 1106 where a new pre-compensator setting may be selected from possible pre-compensator values. At operation 1108, a single-tone pilot signal may be generated at frequency $-f_k$ and applied at baseband to the TX path 700. At operation 1110, the signal at the output of the ABB filter in the envelope detector path at frequency $2f_k$ may be captured. At operation 1112, the method may check the power of the captured signal. If the power is a non-negligible value, the method may return to operation 1106. If the power is zero or a negligible value, the method may proceed to operation 1114 where the optimal value for the pre-compensator settings for frequency $f_k$ may be set to the current settings. At operation 1116, the procedure may be repeated for the single-tone signal generated at $f_k$.

At operation 1118, the method may increment the value of the counter k and return to operation 1104, where the method may check the value of the counter k. If k is greater than the maximum value K, the method may proceed to operation 1120 where, using the pre-compensation settings for $\pm f_1, \ldots \pm f_K$, the method may estimate the IQMM parameters $\phi_{TX}$ and $V_{TX}(f)$, $f=\pm f_1, \ldots, \pm f_K$. At operation 1122, the method may use $\phi_{TX}$ and $V_{TX}(f)$, $f=\pm f_1, \ldots, \pm f_K$ to estimate coefficients for the TX IQMM pre-compensator 718. The method may then terminate at operation 1124.

Figure 12:
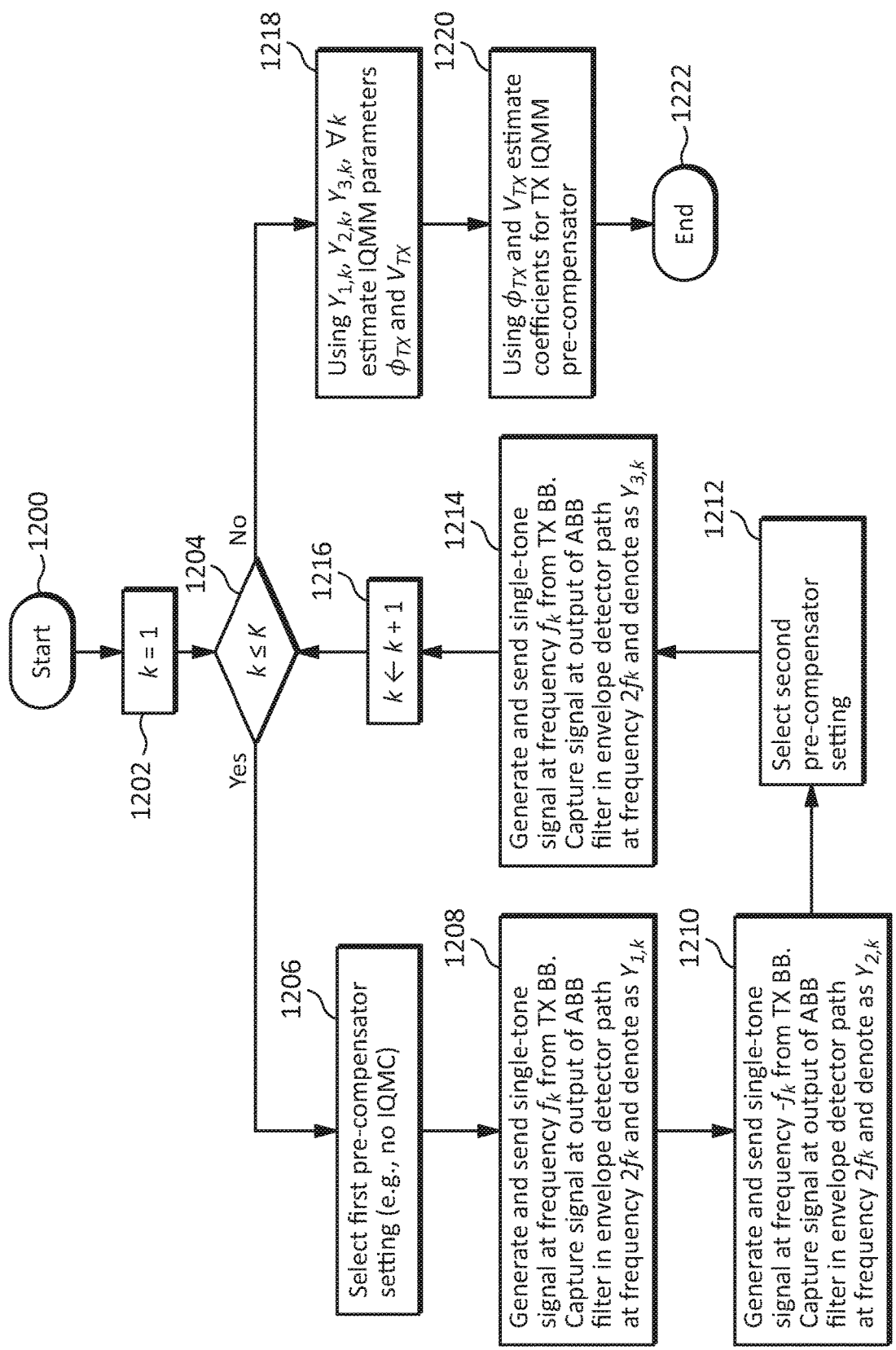
FIG. 12 illustrates an embodiment of a second method for TX IQMM calibration using an envelope detector according to this disclosure.

FIG. 12 illustrates an embodiment of a second method for TX IQMM calibration using an envelope detector according to this disclosure. The method illustrated in FIG. 12 may be used, for example, with the system illustrated in FIG. 7. The method illustrated in FIG. 12 may begin at operation 1200. At operation 1202, a counter k may be initialized to 1. At operation 1204, the method may check the value of the counter k. If k is less than or equal to the maximum value K, the method may proceed to operation 1206 where a first pre-compensator setting, for example with no IQMC, may be selected. At operation 1208, the method may generate and send a single-tone signal at frequency $f_k$ at the BB of transmit path 700. The signal at the output of ABB filter 730 and 732 in the envelope detector path may be captured at frequency $2f_k$ and denoted as $Y_{1,k}$.

In some embodiments, the signal may be captured after the ADCs 734 and 736. At operation 1210, the method may generate and send a single-tone signal at frequency $-f_k$ at the BB of transmit path 700. The signal at the output of ABB filter 730 and 732 in the envelope detector path may be captured at frequency $2f_k$ and denoted as $Y_{2,k}$. At operation 1212, the method may select a second pre-compensator setting to apply to the TX path 700. At operation 1214, the method may generate and send a single-tone signal at frequency $f_k$ at the BB of transmit path 700. The signal at the output of ABB filter 730 and 732 in the envelope detector path may be captured at frequency $2f_k$ and denoted as $Y_{3,k}$.

At operation 1216, the method may increment the value of the counter k and return to operation 1204, where the method may check the value of the counter k. If k is greater than the maximum value K, the method may proceed to operation 1218 where, using $Y_{1,k}, Y_{2,k}$, and $Y_{3,k}$ for every k, the method may estimate the IQMM parameters $\phi_{TX}$ and $V_{TX}(f)$, $f=\pm f_1, \ldots, \pm f_K$. At operation 1220, the method may use $\phi_{TX}$ and $V_{TX}(f)$, $f=\pm f_1, \ldots, \pm f_K$ to estimate coefficients for the TX IQMM pre-compensator 718. The method may then terminate at operation 1222.

Figure 13:
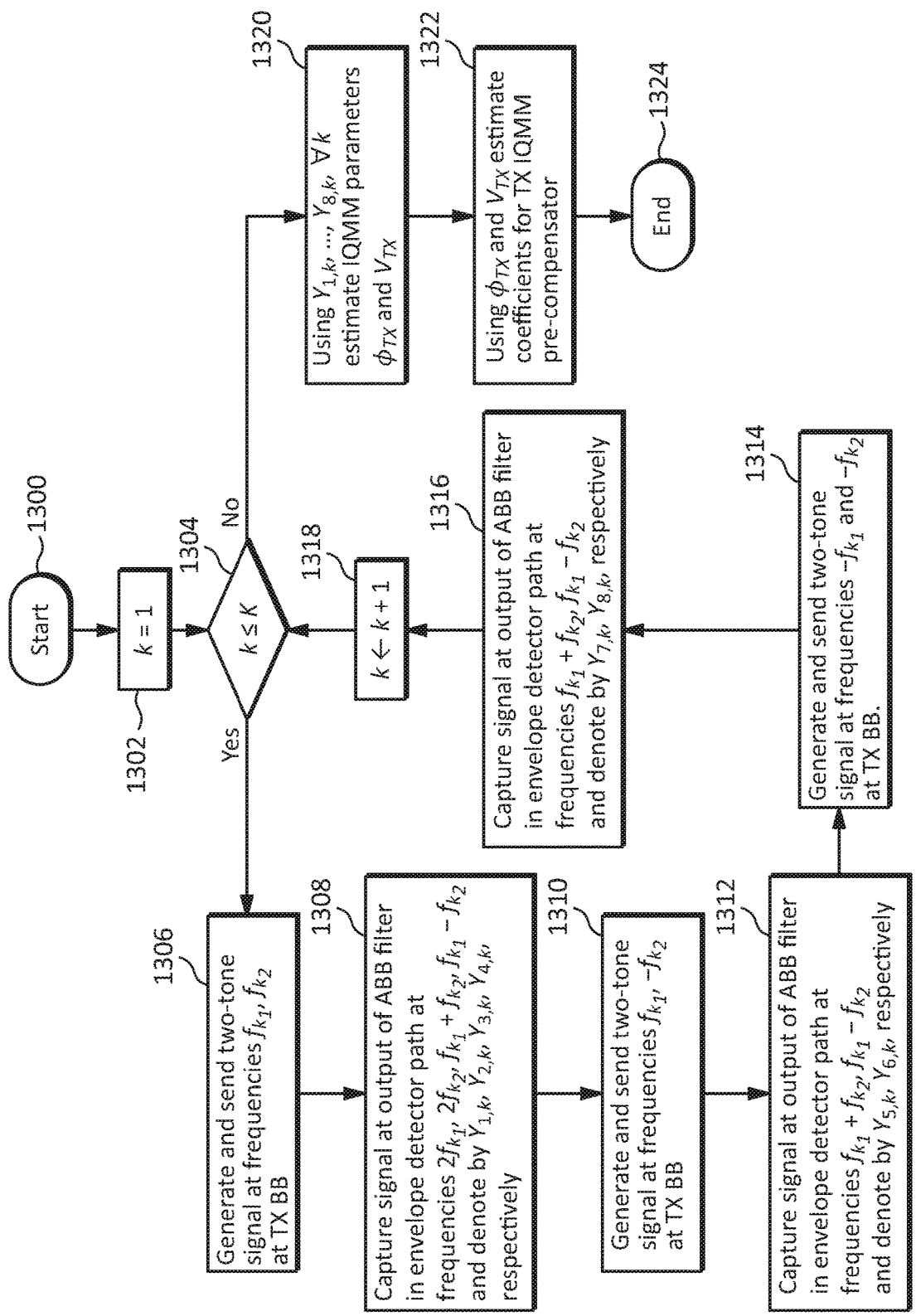
FIG. 13 illustrates an embodiment of a third method for TX IQMM calibration using an envelope detector according to this disclosure.

FIG. 13 illustrates an embodiment of a third method for TX IQMM calibration using an envelope detector according to this disclosure. The method illustrated in FIG. 13 may be used, for example, with the system illustrated in FIG. 7. The method illustrated in FIG. 13 may begin at operation 1300. At operation 1302, a counter k may be initialized to 1. At operation 1304, the method may check the value of the counter k. If k is less than or equal to the maximum value K, the method may proceed to operation 1306 where a two-tone signal may be generated and sent at frequencies $f_{k_1}$, $f_{k_2}$ at baseband of the TX path 700. At operation 1308, the signal at the output of ABB filter 730 and 732 in the envelope detector path may be captured at frequencies $2f_{k_1}$, $2f_{k_2}$, $f_{k_1}+f_{k_2}$, $f_{k_1}-f_{k_2}$, and denoted as $Y_{1,k}, Y_{2,k}, Y_{3,k}, Y_{4,k}$, respectively. At operation 1310, a two-tone signal may be generated and sent at frequencies $f_{k_1}, -f_{k_2}$ at baseband of the TX path 700. At operation 1312, the signal at the output of ABB filter 730 and 732 in the envelope detector path may be captured at frequencies $f_{k_1}+f_{k_2}$, $f_{k_1}-f_{k_2}$, and denoted as $Y_{5,k}$, $Y_{6,k}$, respectively. At operation 1314, a two-tone signal may be generated and sent at frequencies $-f_{k_1}$, $-f_{k_2}$, at baseband of the TX path 700. At operation 1316, the signal at the output of ABB filter 730 and 732 in the envelope detector path may be captured at frequencies $f_{k_1}+f_{k_2}$, $f_{k_1}-f_{k_2}$, and denoted as $Y_{7,k}$, $Y_{8,k}$, respectively.

At operation 1318, the method may increment the value of the counter k and return to operation 1304, where the method may check the value of the counter k. If k is greater than the maximum value K, the method may proceed to operation 1320 where, using $Y_{1,k}, \ldots, Y_{8,k}$, for every k, the method may estimate the IQMM parameters $\phi_{TX}$ and $V_{TX}(f)$, $f=\pm f_1, \ldots, \pm f_K$. At operation 1322, the method may use $\phi_{TX}$ and $V_{TX}(f)$, $f=\pm f_1, \ldots, \pm f_K$ to estimate coefficients for the TX IQMM pre-compensator 718. The method may then terminate at operation 1324.

Figure 14:
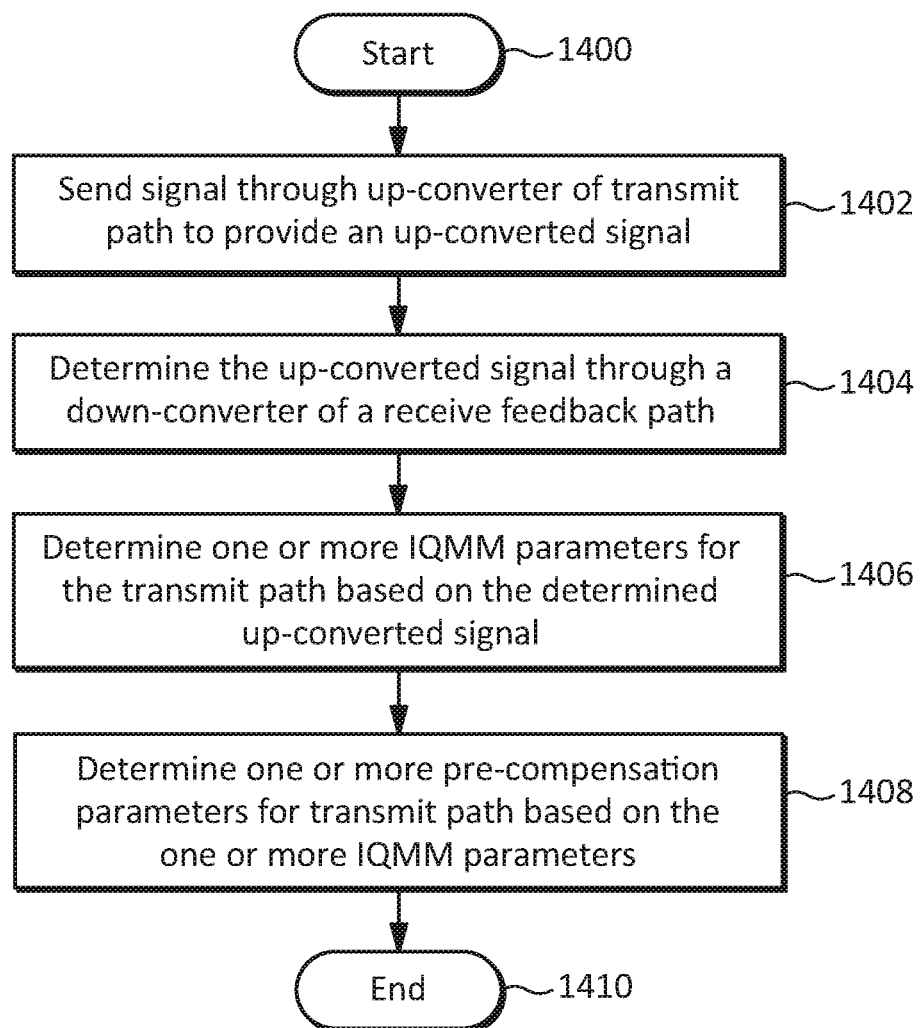
FIG. 14 illustrates an embodiment of a method of pre-compensating for transmitter IQMM according to this disclosure.

FIG. 14 illustrates an embodiment of a method of pre-compensating for transmitter IQMM according to this disclosure. The method may begin at operation 1400. At operation 1402, the method may send a signal through an up-converter of a transmit path to provide an up-converted signal. At operation 1404, the method may determine the up-converted signal through a down-converter of a receive feedback path. At operation 1406, the method may determine one or more IQMM parameters for the transmit path based on the determined up-converted signal, and at operation 1408, the method may determine one or more pre-compensation parameters for the transmit path based on the one or more IQMM parameters for the transmit path. The method may end at operation 1410.

Figure 15:
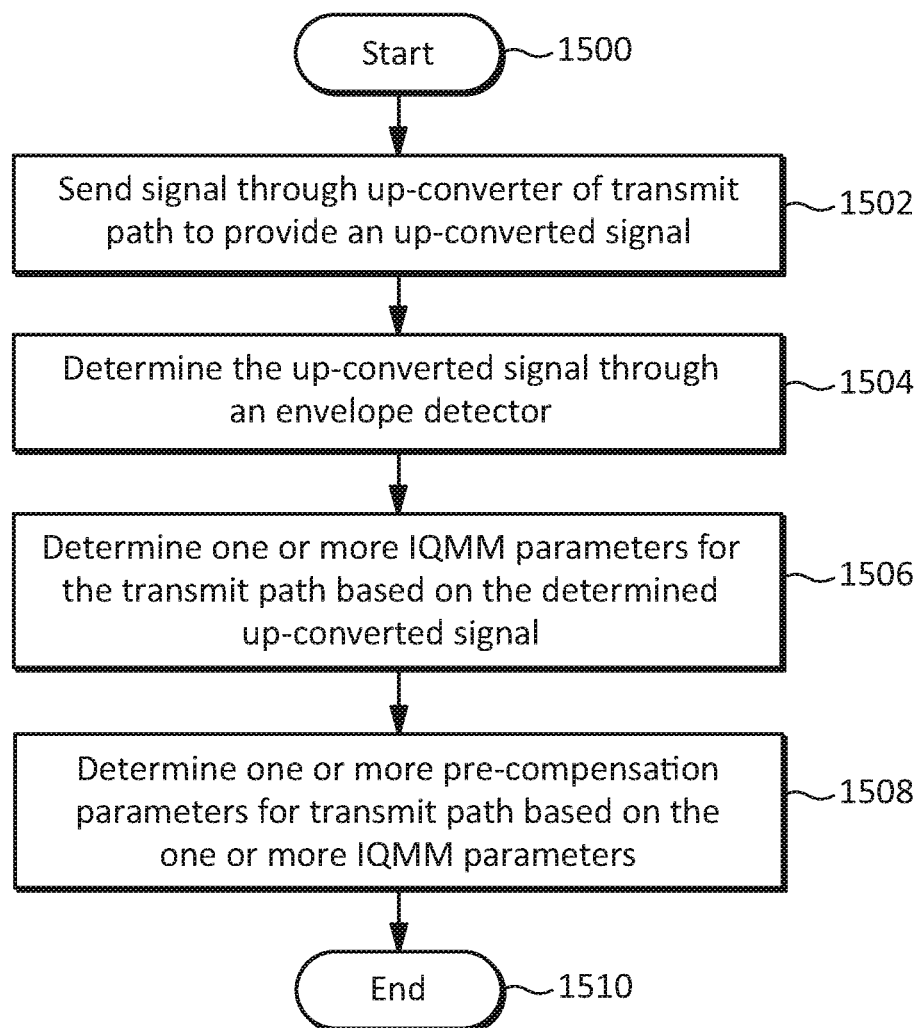
FIG. 15 illustrates another embodiment of a method of pre-compensating for transmitter IQMM according to this disclosure.

FIG. 15 illustrates another embodiment of a method of pre-compensating for transmitter IQMM according to this disclosure. The method may begin at operation 1500. At operation 1502, the method may send a signal through an up-converter of a transmit path to provide an up-converted signal. At operation 1504, the method may determine the up-converted signal through an envelope detector. At operation 1506, the method may determine one or more IQMM parameters for the transmit path based on the determined up-converted signal, and at operation 1508, the method may determine one or more pre-compensation parameters for the transmit path based on the one or more IQMM parameters for the transmit path. The method may end at operation 1510.

The operations and/or components described with respect to the embodiments illustrated in FIGS. 14 and 15, as well as any other embodiments described herein, are example operations and/or components. In some embodiments, some operations and/or components may be omitted and/or other operations and/or components may be included. Moreover, in some embodiments, the temporal and/or spatial order of the operations and/or components may be varied.

This disclosure encompasses numerous inventive principles relating to association and authentication for multi access point coordination. These principles may have independent utility and may be embodied individually, and not every embodiment may utilize every principle.

Moreover, the principles may also be embodied in various combinations, some of which may amplify the benefits of the individual principles in a synergistic manner.

The embodiments disclosed above have been described in the context of various implementation details, but the principles of this disclosure are not limited to these or any other specific details. For example, some functionality has been described as being implemented by certain components, but in other embodiments, the functionality may be distributed between different systems and components in different locations and having various user interfaces. Certain embodiments have been described as having specific processes, steps, etc., but these terms also encompass embodiments in which a specific process, step, etc. may be implemented with multiple processes, steps, etc., or in which multiple process, steps, etc. may be integrated into a single process, step, etc. A reference to a component or element may refer to only a portion of the component or element.

The use of terms such as "first" and "second" in this disclosure and the claims may only be for purposes of distinguishing the things they modify and may not indicate any spatial or temporal order unless apparent otherwise from context. A reference to a first thing may not imply the existence of a second thing. Various organizational aids such as section headings and the like may be provided as a convenience, but the subject matter arranged according to these aids and the principles of this disclosure are not limited by these organizational aids.

The various details and embodiments described above may be combined to produce additional embodiments according to the inventive principles of this patent disclosure. Since the inventive principles of this patent disclosure may be modified in arrangement and detail without departing from the inventive concepts, such changes and modifications are considered to fall within the scope of the following claims.

The invention claimed is:

1. A method of pre-compensating for transmitter in-phase (I) and quadrature (Q) mismatch (IQMM), the method comprising:
sending a signal through an up-converter of a transmit path to provide an up-converted signal;
determining the up-converted signal through a down-converter of a receive feedback path;
determining one or more IQMM parameters for the transmit path based on the determined up-converted signal; and
determining one or more pre-compensation parameters for the transmit path based on the one or more IQMM parameters for the transmit path;
wherein the signal comprises a first signal at a first frequency, the up-converted signal comprises a first up-converted signal, and the method further comprises:
sending a second signal at a second frequency through the up-converter of the transmit path to provide a second up-converted signal;
determining the second up-converted signal through the down-converter of the receive feedback path; and
determining the one or more IQMM parameters for the transmit path based on the determined second up-converted signal.

2. A method of pre-compensating for transmitter in-phase (I) and quadrature (Q) mismatch (IQMM), the method comprising:
sending a signal through an up-converter of a transmit path to provide an up-converted signal;
determining the up-converted signal through a down-converter of a receive feedback path;
determining one or more IQMM parameters for the transmit path based on the determined up-converted signal; and
determining one or more pre-compensation parameters for the transmit path based on the one or more IQMM parameters for the transmit path;
the method further comprising:
sweeping a frequency of the signal sent through the up-converter of the transmit path to provide additional up-converted signals;

determining the additional up-converted signals through the down-converter of the receive feedback path; and determining the one or more IQMM parameters for the transmit path based on the additional determined up-converted signals.

3. A method of pre-compensating for transmitter in-phase (I) and quadrature (Q) mismatch (IQMM), the method comprising:

sending a signal through an up-converter of a transmit path to provide an up-converted signal;

determining the up-converted signal through an envelope detector;

determining one or more IQMM parameters for the transmit path based on the determined up-converted signal; and determining one or more pre-compensation parameters for the transmit path based on the one or more IQMM parameters for the transmit path;

wherein determining the one or more IQMM parameters for the transmit path comprises:

applying a first pre-compensation parameter to the transmit path;

determining a first power of a component of the up-converted signal caused by transmit IQMM through the envelope detector based on the first pre-compensation parameter;

applying a second pre-compensation parameter to the transmit path; and determining a second power of a component of the up-converted signal caused by transmit IQMM through the envelope detector based on the second pre-compensation parameter; and wherein determining the one or more IQMM parameters for the transmit path further comprises selecting one of the first pre-compensation parameter or the second pre-compensation parameter based on a lower of the first power and the second power.

4. The method of claim 3, wherein:

the method further comprises:

applying one or more additional pre-compensation parameters to the transmit path; and determining one or more additional powers of one or more components of the up-converted signal caused by transmit IQMM through the envelope detector based on the one or more additional pre-compensation parameters; and determining the one or more IQMM parameters for the transmit path comprises selecting one of the first pre-compensation parameter, the second pre-compensation parameter or the one or more additional pre-compensation parameters based on a lower of the first power, the second power, or the one or more additional powers.

5. A method of pre-compensating for transmitter in-phase (I) and quadrature (Q) mismatch (IQMM), the method comprising:

sending a signal through an up-converter of a transmit path to provide an up-converted signal;

determining the up-converted signal through an envelope detector;

determining one or more IQMM parameters for the transmit path based on the determined up-converted signal; and determining one or more pre-compensation parameters for the transmit path based on the one or more IQMM parameters for the transmit path;

wherein determining the one or more IQMM parameters for the transmit path comprises:

applying a first pre-compensation parameter to the transmit path;

determining a first power of a component of the up-converted signal caused by transmit IQMM through the envelope detector based on the first pre-compensation parameter;

applying a second pre-compensation parameter to the transmit path; and determining a second power of a component of the up-converted signal caused by transmit IQMM through the envelope detector based on the second pre-compensation parameter;

the method further comprising:

sweeping a frequency of the signal sent through the up-converter of the transmit path to provide additional up-converted signals;

determining the additional up-converted signals through the envelope detector; and determining the one or more IQMM parameters for the transmit path based on the additional determined up-converted signals.

6. A method of pre-compensating for transmitter in-phase (I) and quadrature (Q) mismatch (IQMM), the method comprising:

sending a signal through an up-converter of a transmit path to provide an up-converted signal;

determining the up-converted signal through an envelope detector;

determining one or more IQMM parameters for the transmit path based on the determined up-converted signal; and determining one or more pre-compensation parameters for the transmit path based on the one or more IQMM parameters for the transmit path;

wherein the signal comprises a first signal at a first frequency, the up-converted signal comprises a first up-converted signal, and the method further comprises:

sending a second signal at a second frequency through the up-converter of the transmit path to provide a second up-converted signal;

determining the second up-converted signal through the envelope detector, and determining the one or more IQMM parameters for the transmit path based on the determined second up-converted signal.

7. The method of claim 6, wherein:

the method further comprises applying first and second pre-compensation parameters to the transmit path for each of the first and second signals; and the first and second up-converted signals are determined separately based on the first and second pre-compensation parameters.

8. The method of claim 7, wherein:

determining one or more IQMM parameters for the transmit path comprises solving a system of equations based on the determined first and second up-converted signals; and a first one of the equations comprises a function, at least in part, of the first and second pre-compensation parameters.

9. The method of claim 7, wherein the second frequency is a negative of the first frequency at baseband.

10. The method of claim 7, further comprising:

sweeping the first and second frequencies for each of the first and second pre-compensation parameters;

determining additional first and second up-converted signals based on sweeping the first and second frequencies; and determining the one or more IQMM parameters for the transmit path over frequency based on the determined additional up-converted signals.

* * * * *